(12) United States Patent
Murata

(10) Patent No.: US 7,839,704 B2
(45) Date of Patent: Nov. 23, 2010

(54) MEMORY CIRCUIT AND CONTROL METHOD THEREOF

(75) Inventor: Seiji Murata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 80 days.

(21) Appl. No.: 12/405,494

(22) Filed: Mar. 17, 2009

(65) Prior Publication Data
US 2009/0296500 A1 Dec. 3, 2009

(30) Foreign Application Priority Data
May 30, 2008 (JP) ............................... 2008-141854

(51) Int. Cl.
*G11C 7/00* (2006.01)
*G11C 7/22* (2006.01)
(52) U.S. Cl. .................. 365/189.16; 365/191; 365/154; 365/156
(58) Field of Classification Search ............ 365/189.16, 365/191, 154, 156
See application file for complete search history.

(56) References Cited

U.S. PATENT DOCUMENTS 5,973,984 A 10/1999 Nagaoka
7,573,757 B2 * 8/2009 Ha et al. ................. 365/189.15

FOREIGN PATENT DOCUMENTS

JP 11-110969 4/1999

* cited by examiner

*Primary Examiner*—Huan Hoang
*Assistant Examiner*—Kretelia Graham
(74) *Attorney, Agent, or Firm*—Staas & Halsey LLP

(57) ABSTRACT

A memory circuit having a global signal driving circuit, which, when a first read signal is inputted from a first bit signal line with a column signal inputted from a column signal line, outputs the first read signal as a global signal from a global signal line, and, when a first driving write signal is inputted from the first bit signal line, inhibits the first driving write signal from being outputted to the global signal line on the basis of a first write signal inputted from a first write signal line.

8 Claims, 14 Drawing Sheets

FIG. 4

| Operation Mode | WE | DI | DIT | DIC |
|---|---|---|---|---|
| Write | 0 | 0 | High Pulse | 0 |
| | 0 | 1 | 0 | High Pulse |
| Read | 1 | 0 | 0 | 0 |

MEMORY CIRCUIT AND CONTROL METHOD THEREOF

CROSS-REFERENCE TO RELATED APPLICATION

This application is based upon and claims benefit of priority of the prior Japanese Patent Application No. 2008-141854, filed on May 30, 2008, the entire contents of which are incorporated herein by reference.

FIELD

The present invention relates to a control technique at the time of data writing in an SRAM (Static Random Access Memory), for example.

BACKGROUND

FIGS. 11 and 12 are diagrams schematically showing configuration of a known SRAM.

As shown in FIG. 11, a known SRAM (Static Random Access Memory) 101 has a final decoder 102, a control generator 103, a clock generator 104, read/write blocks 106a and 106b, I/O circuits 105a and 105b, and memory cell arrays 107a and 107b.

Each of the memory cell arrays 107a and 107b has a plurality of memory circuits called memory cells which hold data, and is connected to a bit line.

The read/write blocks 106a and 106b each writes and reads data to and from the memory cell array 107a and 107b via the bit line, having a sense amplifier (not shown), etc., for example. Incidentally, the read/write block 106a performs the processes on the memory array 107a, while the read/write block 106b performs the processes on the memory array 107b.

The I/O circuits 105a and 105b exchange data between the SRAM 101 and the outside. The I/O circuit 105a is provided for the read/write block 106a, while the I/O circuit 105b is provided for the read/write block 106b.

The final decoder 102 performs address decoding of the memory cells. The clock generator 104 generates a clock for operations of the SRAM 101, and performs the pre-decoding process. The control generator 103 performs various controls via the read/write blocks 106a and 106b.

In the SRAM 101 shown in FIG. 11, the sense amplifier in each of the read/write blocks 106a and 106b detects a minute difference in amplitude in the memory cell in the read operation, and amplifies the difference to read the data.

In these years, the SRAM 101 is configured more minutely, which degrades the conditions for data reading in the SRAM 101. In order to overcome the degradation of the reading conditions in the SRAM 101 configured minutely, there has been proposed a technique that divides the bit line into a plurality of portions (blocks) to decrease the load at the time of the data reading (refer to Patent Document 1, etc. below).

In the SRAM 101 shown in FIG. 12, each of the bit lines in the SRAM 101 shown in FIG. 11 is divided into four blocks (local blocks) to divide the memory cell array 107a into four local blocks 110a-0 to 110a-3. Similarly, the memory cell array 107b is divided into four to form local blocks 110b-0 to 110b-3.

In the example shown in FIG. 12, the read/write block 106 is formed in each of the local blocks 110a-0 to 110a-3 and 110b-0 to 110b-3, and two memory cell arrays 107 and 107 are formed, sandwiching the read/write block 106. The read/write block 106 controls these two memory cell arrays 107 and 107.

For example, between the local blocks 110a-3 and 110b-3, formed is a control block CB03, in which a control generator 103 is formed, together with two final decoders 102 and 102 sandwiching the control generator 103. The two final decoders 102 and 102 are formed, correspondingly to two memory cell arrays 107 and 107 in the adjacent local blocks 110.

In the example shown in FIG. 12, the read/write block 106 and the two memory cell arrays 107 are shown in only the local block 110b-3, for the sake of convenience. Like the local block 110b-3, the read/write block 106 and the two memory cell arrays 107 are provided in each of the other local blocks 110a-0 to 110a-3, and 110b-0 to 110b-2.

Similarly, in the example shown in FIG. 12, the control generator 103 and the two final decoders 102 are shown in only the control block CB03, for the sake of convenience. Like the control block CB03, the control generator 103 and the two final decoders 102 are provided in each of the other control blocks CB00 to CB02.

Incidentally, like reference characters in the drawings designate like or corresponding parts, detailed description of which are omitted here.

As shown in FIG. 12, the memory cell arrays 107a and 107b are divided into a plurality of blocks to form a plurality of local blocks, which makes it possible to read data from each memory cell at high speed. At the same time, discharging of the bit lines can be done at high speed, which can shorten the unstable period of the memory cell.

[Patent Document 1] Japanese Patent Application Laid-Open Publication No. HEI11-110969

However, in such the known SRAM 101 shown in FIG. 12, the read/write block is required in each of the local blocks 110a-0 to 110a-3 and 110b-0 to 110b-3, which increases the macro area according to the number (dividing number) of the formed local blocks 110a-0 to 110a-3 and 110b-0 to 110b-3.

In the designing stage, it is required to design the read/write block 106 with the minimum configuration in order to suppress an increase in area of the read/write blocks 106. However, simplification of the configuration of the read/write block 106 makes it difficult to gain attentive controls at the time of reading and writing, separately, resulting in that the write data drives circuits and a read output terminal that do not relate to the operation through the bit line, which increases the power consumption.

FIG. 13 is a diagram showing an example of circuit configuration of part of a known SRAM 101.

The known SRAM 101 shown in FIG. 13 has a memory cell 1071, a write driver 1061, a GBL reset 1062, a write amplifier 1063, a GBL driver 1064, a column switch 1065, a sense amplifier 1066 and a pre-charge/equalizer 1067.

Among them, the GBL driver 1064, the column switch 1065, the sense amplifier 1066 and the pre-charge/equalizer 1067 are formed in the read/write block 106, for example.

In FIGS. 13, a reference character WL a word line, SAEN a sense amplifier enable signal, PC_B a bit line pre-charge signal and CSEL a column selection signal.

Reference characters DIT and DIC designate write signals. The write signal DIT designates a true signal, while the write signal DIC designates a complementary signal thereof. Similarly, reference characters BL and BLB designate local bit lines. The local bit line BL is a true value, while the local bit line BLB is a complementary signal thereof.

A reference character GBL designates a global bit line, WCK a pulsed clock signal, and WE a write enable signal. A reference character DI designates an input signal, which is data inputted from the outside of the SRAM 101.

The GBL driver 1064 sends out a read signal, which has been read out from the memory cell 1071 and amplified by the sense amplifier 1064, to the global bit line GBL, and sends out a write signal, which has been inputted from the write driver 1061 and amplified by the write amplifier 1063, to the local bit lines BL and BLB.

In the known SRAM 101 shown in FIG. 13, the GBL driver 1064 has PFETs 651 and 652, and NFETs 653 to 655.

The PFET 651 has a gate terminal to which the local bit line BL is connected, a source terminal to which a power source is connected, and a drain terminal to which a source terminal of the PFET 652 is connected.

The FET 652 has a gate terminal to which the column selection signal CSEL can be inputted, and a drain terminal to which a drain terminal of the NFET 653, a drain terminal of the NFET 654 and a gate terminal of the NFET 655 are connected.

The NFET 653 has a gate terminal to which the pre-discharge signal PDC can be inputted, and a source terminal which is grounded.

The FET 654 has a gate terminal to which the global bit line GBL is connected, and a source terminal which is grounded. The NFET 655 has a drain terminal to which the global bit line GBL is connected, and a gate terminal to which the drain terminal of the PFET 652 is connected. A source terminal of the NFET 655 is grounded.

FIG. 14 is a timing chart showing an example of state of signals at the time of data writing in the known SRAM. In FIG. 14, a reference character CLK designates a system clock.

Assuming here that the memory cell 1071 is selected at the time of data writing in the known SRAM 101, that is, "0" is set as the column selection signal CSEL (refer to a point C1 in FIG. 14), and "0" is inputted as both the write enable signal WE and the input signal DI to the write driver 1061 (refer to "cycle 2" in FIG. 14) (refer to point C2 in FIG. 14).

Since "0" is inputted as both the write enable signal WE and the input signal D1, the local bit lines BL is discharged. On this occasion, the PFET 652 is turned on, hence the local bit line BL and the global bit line GBL are connected.

Namely, in the GBL driver 1064, the global bit line GBL is discharged via the PFETs 651 and 652 (refer to point C3 in FIG. 14), whereby "0" is outputted as the read signal RD in cycle 3 (refer to point C4 in FIG. 14).

In the known SRAM 101, in "cycle 1" where the write enable signal WE is "0" and the input signal DI is "1", the global bit line GBL keeps "1", hence "1 (High)" is kept as the read signal RD. In "cycle 2" where the write enable signal WE is "0" and the input signal DI is "0", the GBL driver 1064 is operated to discharge the global bit line GBL, hence "0" is outputted as the read signal RD in cycle 3.

In other words, the write signal DIT is outputted to the global bit line GBL via the PFETs 651 and 652 for reading use.

As above, since the write signal DIT is outputted to the global bit line GBL at the time of data writing, other circuits (not shown) and the read output terminal (not shown) which do not relate to the operation are driven, which increases the power consumption of the SRAM.

SUMMARY

According to an aspect of the present invention, a memory circuit comprising a write signal driving circuit connected to a data input signal line to which write data is inputted from the outside, a write enable signal line for permitting the write data to be written, a first write signal line, and a second write signal line to output a first write signal and a second write signal from the first write signal line and the second write signal line, respectively, based on the write data from the data input signal line and a write enable signal from the write enable signal line, a write signal amplifying circuit connected to a column signal line for selecting a column of the memory circuit to write or read data, the first write signal line, the second write signal line, a first bit signal line and a second bit signal line to output the first write signal and the second write signal inputted from the first write signal line and the second write signal line as a first driving write signal and a second driving write signal from the first bit signal line and the second bit signal line, respectively, based on a column signal inputted from the column signal line, a memory cell circuit connected to the first bit signal line and the second bit signal line to store data, based on the first driving write signal and the second driving write signal line inputted from the first bit signal line and the second bit signal line, and to output the stored data as a first read signal and a second read signal from the first bit signal line and the second bit signal line, and a global signal driving circuit connected to the first bit signal line, the first write signal line, the column signal line, and a global signal line for outputting data stored in the memory cell circuit to the outside to output the first read signal as a global signal from the global signal line when the first read signal is inputted from the first bit signal line, and to inhibit the first driving write signal from being outputted to the global signal line, based on the first write signal inputted from the first write signal line, when the first driving write signal is inputted from the first bit signal line, with the column signal inputted from the column signal line.

According to another aspect of the present invention, a control method of a memory circuit having a write signal driving circuit inputted thereto write data and outputting a write signal, a write signal amplifying circuit inputted thereto the write signal and outputting a driving write signal, a memory cell circuit inputted thereto the driving write signal and storing data and outputting a read signal and a global signal driving circuit inputted thereto the read signal and outputting a global signal, the control method comprising the steps of, by the write signal driving circuit connected to a data input signal line to which the write data is inputted from the outside, a write enable signal line for permitting the write data to be written, a first write signal line and a second write signal line, outputting a first write signal and a second write signal from the first write signal line and the second write signal line, respectively, based on the write data from the data input signal line and a write enable signal from the write enable signal line, by the write signal driving circuit connected to a column signal line for selecting a column of the memory circuit to write or read data, the first write signal line, the second write signal line, a first bit signal line and a second bit signal line, outputting the first write signal and the second write signal inputted from the first write signal line and the second write signal line as a first driving write signal and a second driving write signal from the first bit signal line and the second bit signal line, based on a column signal inputted from the column signal line, by the memory cell circuit connected to the first bit signal line and the second bit signal line, storing data, based on the first driving write signal and the second driving write signal inputted from the first bit signal line and the second bit signal line, and outputting the stored data as a first read signal and a second read signal from the first bit signal line and the second bit signal line, and, by the global signal driving circuit connected to the first bit signal line, the first write signal line, the column signal line and a global signal line for outputting data stored in the memory cell circuit to the outside, outputting the first read signal as the global signal from the global signal line when the first read signal is inputted from the first bit signal line, and inhibiting the first driving write signal from being outputted to the global signal line, based on the first write signal inputted from the first write signal line, when the first driving write signal is inputted from the first bit signal line, with the column signal inputted from the column signal line.

Additional objects and advantages of the embodiment will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF DRAWINGS

FIG. 4 is a diagram showing an example of relationship between input signals and operation mode in a write driver in the memory circuit according to the first embodiment;

DESCRIPTION OF EMBODIMENT(S)

Hereinafter, description will be made of embodiments of a memory circuit and a control method thereof according to the present invention with reference to the accompanying drawings.

(A) First Embodiment

Figure 1:
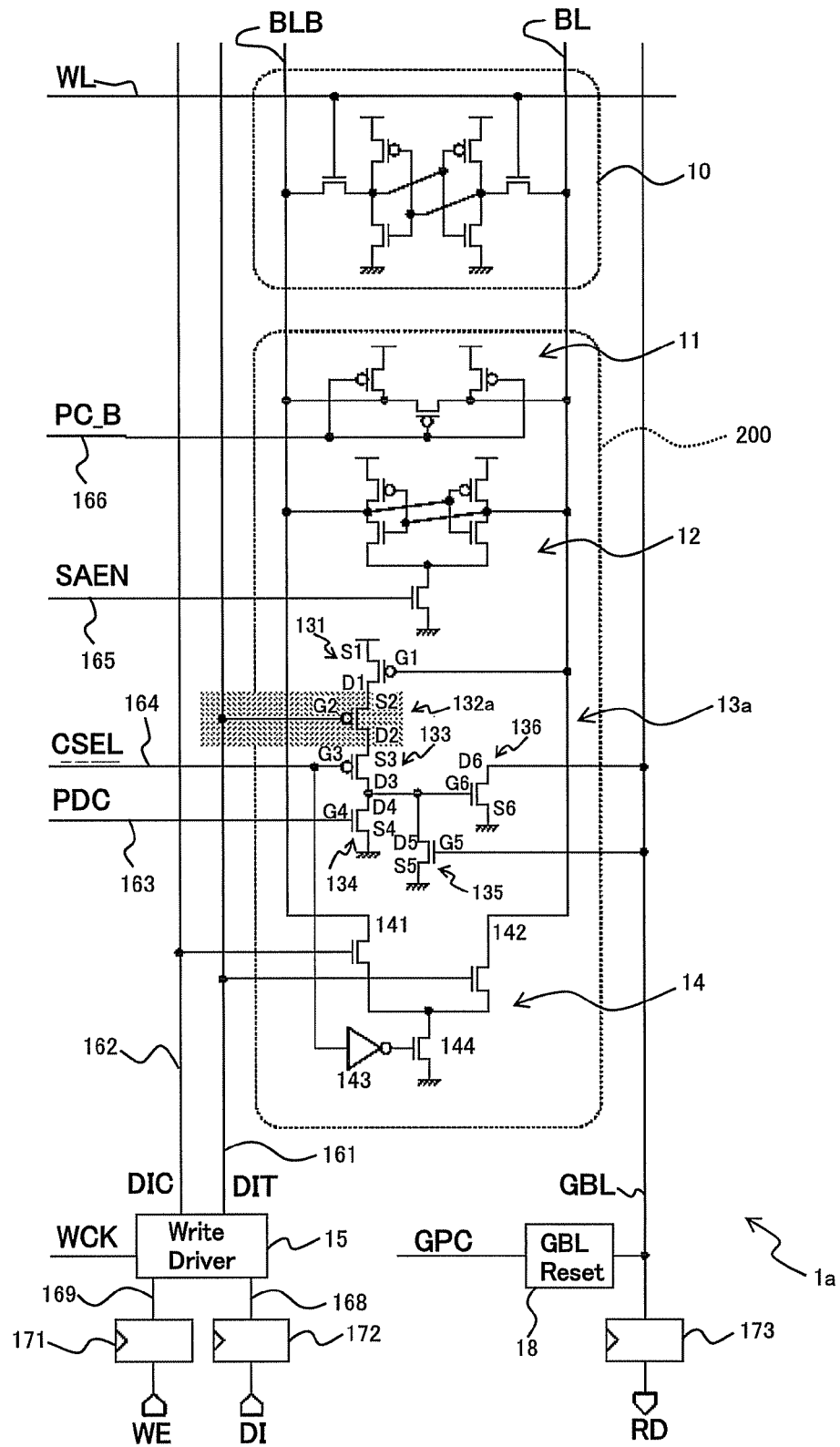
FIG. 1 is a diagram showing an example of part of circuit configuration of a memory circuit according to a first embodiment of this invention.
Figure 2:
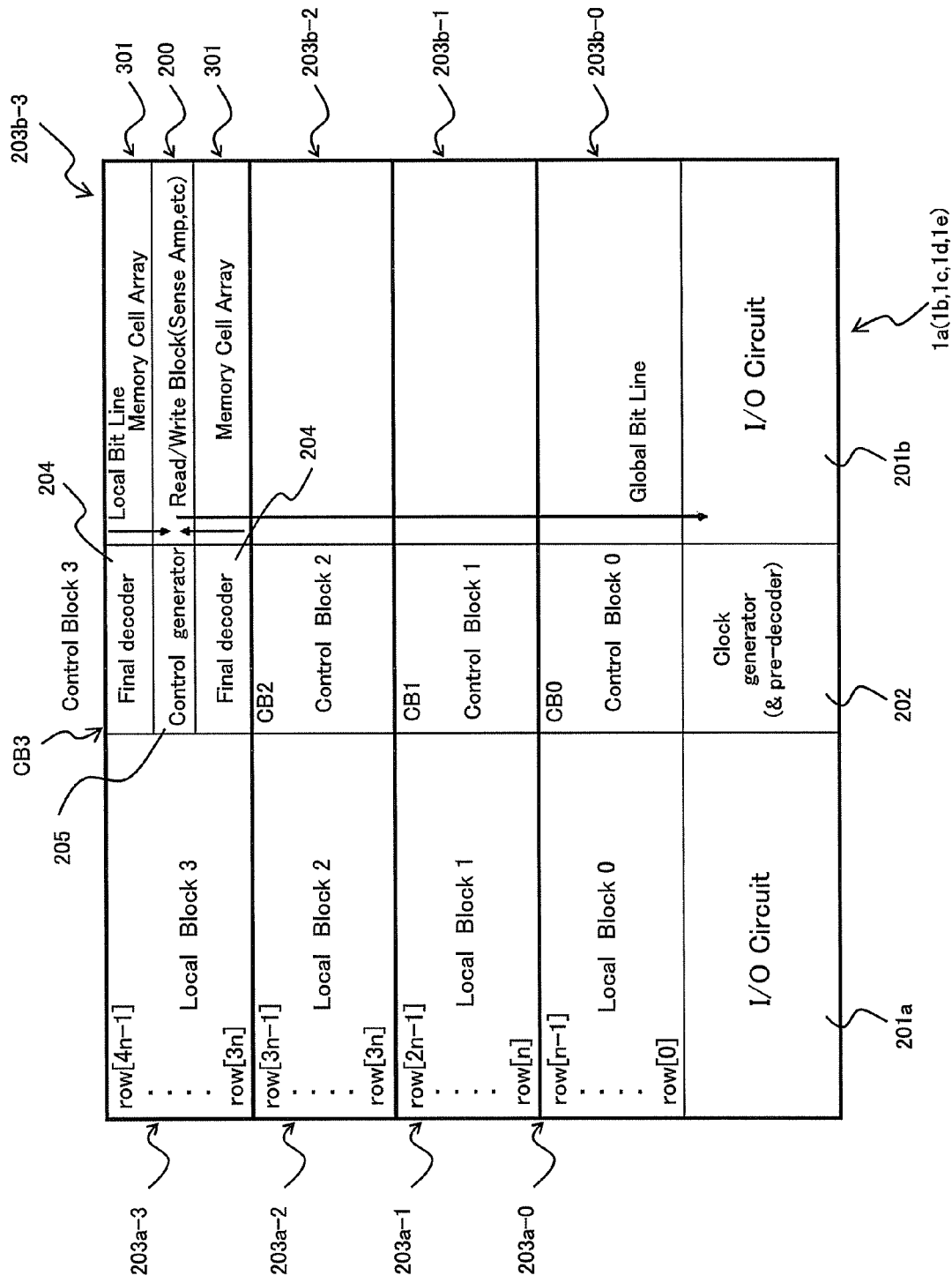
FIG. 2 is a diagram schematically showing configuration of the memory circuit according to the first embodiment.
Figure 3:
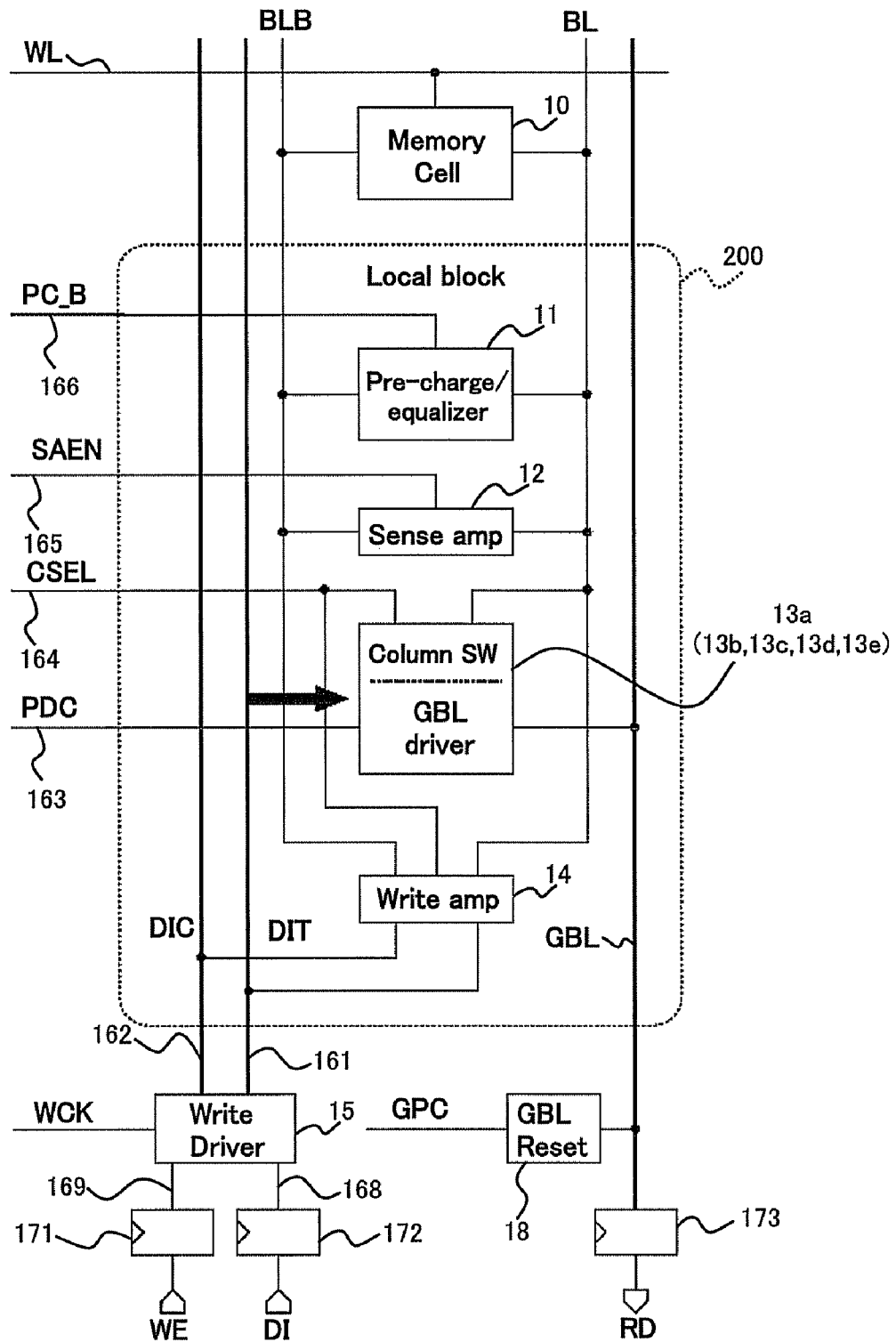
FIG. 3 is a diagram schematically showing functional constitution of the memory circuit according to the first embodiment.

FIG. 1 is a diagram showing part of circuit configuration of a memory circuit 1a according to a first embodiment of a memory circuit and a control method thereof of this invention. FIG. 2 is a diagram schematically showing the configuration of the memory circuit 1a. FIG. 3 is a diagram schematically showing a functional constitution of the memory circuit 1a.

The memory circuit 1a according to this embodiment readably stores data in an SRAM (Static Random Access Memory) or the like. As shown in FIG. 2, the memory circuit 1a comprises local blocks 203a-0 to 203a-3 and 203b-0 to 203b-3, control blocks CB0 to CB3, a clock generator 202 and I/O circuits 201a and 201b.

The local blocks 203a-0 to 203a-3 and 203b-0 to 203b-3 are areas formed on an SRAM 1 to store data therein. In the example shown in FIG. 2, the local blocks 203a-0 to 203a-3 are arranged in a column along a global bit line GBL, while the local blocks 203b-0 to 203b-3 are arranged in a column along the global bit line GBL in parallel to the arrangement direction of the local blocks 203a-0 to 203a-3.

The local blocks 203a-0 to 203a-3 and 203b-0 to 203b-3 have almost similar configurations, each of which comprises a read/write block 200 and a plurality of memory cell arrays 301.

Hereinafter, when it is necessary to designate one of the plural local blocks, any one of reference characters 203a-0 to 203a-3 and 203b-0 to 203b-3 is used as a reference character designating the local block, whereas when an arbitrary local block is designated, a reference character 203 is used.

In each of the local blocks 203, the memory cell arrays 301 and the read/write block 200 are connected by local bit lines (bit signal lines) BL and BLB, and the read/write blocks 200 and the I/O circuit 201a or 201b are connected by a global bit line GBL.

In the example shown in FIG. 2, in the local block 203, two memory cell arrays 301 and 301 are arranged, sandwiching the read/write block 200.

Meanwhile, in the example shown in FIG. 2, detailed configuration of only the local block 203b-3 is shown, for the same of convenience. Other local blocks 203a-0 to 203a-3 and 203b-0 to 203b-2 have a configuration similar to that of the local block 203b-3.

In the memory cell array 301, a plurality of memory cells 10 (refer to FIG. 1) are arranged in a matrix. The memory cell array 301 includes a plurality of word lines WL, and local bit lines (bit signal lines) BL and BLB. Each of the word lines WL is arranged correspondingly to a row of the memory cells 10, and the memory cells 10 in a row are connected to the word line WL. Each pair of the local bit lines BL and BLB is arranged correspondingly to a column of the memory cells 10, and the memory cells 10 in a column are connected to each pair of the local bit lines BL and BLB.

The memory cell (memory cell circuit) 10 retains data at logical value levels of "0" and "1", which is formed by a flip-flop having a plurality of transistors. In the example shown in FIG. 1, there is shown an example where a six-transistor type SRAM memory cell having transistors Q1 to Q6 is used as the memory cell 10. The six-transistor type SRAM memory is known, detailed description of which is thus omitted here.

The read/write block 200 writes data into the memory cell array 10 of the memory cell 301 or reads out data from the memory cell array 10 through the local bit lines BL and BLB, and outputs the data through the global bit line GBL. The data read out by the read/write block 200 is outputted from the I/O circuits 201a and 201b to the outside of the memory circuit 1a. Details of the read/write block 200 will be described later.

The I/O circuits 201a and 201b transmit and receive data to and from the outside of the SRAM 1. The I/O circuit 201a is provided for the local blocks 203a-0 to 203a-3, while the I/O circuit 201b is provided for the local blocks 203b-0 to 203b-3.

The clock generator 202 generates clock for operations of the SRAM 1, or performs a pre-decoding process in order to have an access to the memory cell 10.

The control blocks CB0 to CB3 control accesses by the read/write blocks 200 in the local blocks 203 to the memory cell arrays 301. Each of the control blocks CB0 to CB3 comprises a control generator 205 and final decoders 204.

The final decoder 204 performs address decoding with respect to the memory cell array 301. The control generator 205 performs various controls via the read/write block 200.

In the example shown in FIG. 2, there is shown detailed configuration of only the control block CB3, for the sake of convenience. Like the control block CB3, other control blocks CB0 to CB2 each comprises the control generator 102 and two final decoders 204.

The control blocks CB0 to CB3 are arranged between the local blocks 203a-1 to 203a-3 and the local blocks 203b-1 to 203b-3.

For example, the control block CB3 is formed between the local blocks 203a-3 and 203b-3 to control the local blocks 203a-3 and 203b-3.

The control block CB3 has one or more (two in the example shown in FIG. 2) final decoders 204, each of which corresponds to memory cell arrays 301 of the adjacent local blocks 203.

The control generator 205 is formed, correspondingly to the read/write blocks 200 of the adjacent local blocks 203a-3 and 203b-3.

As shown in FIG. 3, the memory circuit 1a according to the first embodiment of this invention comprises a memory cell 10, a write driver 15, a GBL reset 18, a write amplifier 14, a GBL driver 13a, a sense amplifier 12 and a pre-charge/equalizer 11.

Among them, the write amplifier 14, the GBL driver 13a, the sense amplifier 12 and the pre-charge/equalizer 11 are formed in the local block 203 shown in FIG. 2.

The write driver (write signal driving circuit) 15 generates write signals (driving write signals) DIT and DIC for writing data into the memory cell 10, on the basis of an input signal (write data) DI inputted from the outside of the memory circuit 1a of the first embodiment and a write enable signal WE inputted from the outside of the memory circuit 1a. The write enable signal WE permits the input signal DI to be written into the memory cell 10.

The write enable signal WE and the input signal DI inputted from the outside of the memory circuit 1a of the first embodiment are temporarily captured in latches 171 and 172, respectively.

To the write driver 15, inputted are a pulsed clock signal WCK generated by the clock generator 202, the input signal DI captured in the latch 172 through a data input signal line 168 and the write enable signal WE captured in the latch 171 through a write enable signal line 169.

The write driver 15 is connected to a first write signal line (first write signal line) 161 and a second write signal line (second write signal line) 162 to output the write signal (first write signal) DIT which is a true value signal from the first write signal line 161, while outputting the write signal (second write signal) DIC which is a complementary signal of the true signal from the second write signal line 162. Incidentally, the write driver 15 is known, detailed description of which is thus omitted.

The write signals DIT and DIC outputted from the write driver 15 through the first write signal line 161 and the second write signal line 162 are inputted to the write amplifier 14. In the memory circuit 1a of the first embodiment, the write signal DIT is inputted to the GBL driver 13a through the first write signal line 161.

Data writing operation (write operation) in the memory circuit 1a of the first embodiment is performed by discharging NFETs 141 and 142 in the write amplifier 14 by the write driver 15. The write driver 15 outputs a High pulse to either one of the first write signal line 161 (node DIT) and the second write signal line 162 (node DIC) according to the polarity of input data at the time of writing.

FIG. 4 is a diagram showing an example of a relation between signal input and operation mode in the write driver 15 in the memory circuit 1a according to the first embodiment of the memory circuit and the control method thereof.

As shown in FIG. 4, when "0" is inputted as the write enable signal WE to the write driver 15, for example, the operation mode of the memory circuit 1a becomes "write (write mode)", that is, the write operation. On this occasion, when "0" is inputted as the input signal DI, a High pulse ("1") is outputted as the write signal DIT, and the write signal DIC becomes "0". To the contrary, when "1" is inputted as the input signal DI, the write signal DIT becomes "0", and a High pulse ("1") is outputted as the input signal DIC.

On the other hand, when "1" is inputted as the write enable signal WE to the write driver 15, the operation mode of the memory circuit 1a becomes "read (read mode)", that is, the read operation. On this occasion, even when either "0" or "1" is inputted as the input signal DI, the write signal DIT and the write signal DIC become "0".

In other words, in the memory circuit 1a, the write signals DIT and DIC both keep the "0 (Low)" state at the time of the read operation. At the time of the write operation, either one of the write signals DIT and DIC is pulsed (High pulse) and sent to the read/write block 200. This pulsed signal represents that the circuit is in the write state, thereby to control a PFET 132a (inhibit circuit) in the GBL driver 13a to be described later.

To the write amplifier 14, connected are the first write signal line 161, the second write signal line 162, a column signal line 164 and the local bit lines BL and BLB. The write amplifier 14 amplifies the write signals DIT and DIC inputted from the write driver 15 through the first write signal line 161 and the second write signal line 162.

A column signal CSEL for selecting a column in the memory circuit to perform data writing or reading is inputted to the write amplifier 14 through the column signal line 164.

On the basis of the inputted column signal CSEL, the write amplifier 14 outputs the write signal DIT inputted through the write signal line 161 as a first driving write signal (first driving write signal) PDIT from the local bit line BL, and outputs the write signal DIC inputted through the write signal line 162 as a second driving write signal (second driving write signal) PDIC from the local bit line BLB.

Hereinafter, the first driving write signal PDIT and the second driving write signal PDIC will be simply referred to as write signals, occasionally.

The write amplifier 14 has three transistors 141, 142 and 144, and an inverter 143, as shown in FIG. 1, for example. The transistor 141 has a gate terminal connected to the second signal line 162, a drain terminal connected to the local bit line BLB, and a source terminal connected to a drain terminal of the transistor 144.

The transistor 142 has a gate terminal connected to the first write signal line 161, a drain terminal connected to the local bit line BL, and a source terminal connected to the drain terminal of the transistor 144.

The transistor 144 has a gate terminal connected to the column signal line 164 via the inverter 143, a drain terminal connected to the source terminals of the transistors 141 and 142, and a source terminal grounded.

The memory cell 10 is connected to the local bit lines BL and BLB, and the word line WL to store data on the basis of the first driving write signal PDIT and the second driving write signal PDIC inputted through the local bit lines BL and BLB. The memory cell 10 outputs stored data as a first read signal (first read signal) through the local bit line BL, and outputs stored data as a second read signal (second read signal) through the local bit line BLB.

Hereinafter, the first read signal and the second read signal will be simply referred to as read signals, occasionally. The memory cell 10 is known, detailed description of which is thus omitted.

The pre-charge/equalizer 11 equalizes electric potentials of the local bit lines BL and BLB, and pre-charges the local bit lines BL and BLB to a predetermined voltage level (High level) on the basis of a bit line pre-charge signal, the bit line pre-charge signal being inputted through a bit line pre-charge signal pc_B signal line 166.

The sense amplifier 12 amplifies the read signal read out from the memory cell 10. The sense amplifier 12 amplifies the read signal according to a sense amplifier enable signal SAEN supplied from the outside through a sense amplifier enable signal line 165.

The sense amplifier enable signal SAEN is outputted in each cycle. The sense amplifier 12 amplifies a difference in amplitude between the local bit lines BL and BLB at the time of the read operation of the memory circuit 1a, while functioning as a write assist circuit at the time of the write operation of the memory circuit 1a.

The GBL reset 18 pre-charges the global bit line GBL. Before data reading, the GBL reset 18 pre-charges (resets) the global signal line GBL to a predetermined voltage level on the basis of a global bit line pre-charge signal GPC.

The pre-charge/equalizer 11, the sense amplifier 12 and the GBL reset 18 are known, detailed descriptions of which are thus omitted.

The GBL driver (global signal driving circuit) 13a sends out the read signal read out from the memory cell 10 and amplified by the sense amplifier 12 to the global signal line GBL, and sends out the write signal inputted from the write driver 15 and amplified by the write amplifier 14 to the local bit lines BL and BLB.

To the GBL driver 13a, connected are the column signal line 164, a pre-discharge signal line 163, the local bit lines BL and BLB and the first write signal line 161. When the read signal (first read signal) read out from the memory cell 10 and amplified by the sense amplifier 12 is inputted to the GBL driver 13a through the local bit line BL, with the column signal CSEL being inputted from the column signal line 164, the GBL driver 13a outputs the inputted read signal as a global signal from the global signal line GBL.

The GBL driver 13a has a function as a column switch that has a control to output the read signal in the local bit line BL to the global bit line GBL on the basis of the column signal CSEL inputted from the column signal line 164 in the data reading operation of the memory circuit 1a of the first embodiment.

To the GBL driver 13a, the write signal DIT is inputted from the first write signal line 161. When the write signal DIT is inputted to the GBL driver 13a from the first write signal line 161, the GBL driver 13a inhibits the first driving write signal PDIT generated by the write amplifier 14 from being outputted to the global signal line GBL on the basis of the write signal DIT.

As shown in FIG. 1, the GBL driver 13a is comprised of PFETs (p-type FET (Field effect transistor)) 131, 132a and 133, and NFETs (n-type FET) 134, 135 and 136.

The PFET (first transistor) 131 has a gate terminal (first gate terminal) G1 connected to the local bit line BL, and a source terminal (first source terminal) S1 connected to a power source. A drain terminal (first drain terminal) D1 of the PEFT 131 is connected to a source terminal S2 of the PFET 132a.

The PFET 131 outputs, from the drain terminal D1 thereof, the read signal (first read signal) inputted from the local bit line BL and the first driving write signal PDIT generated by the write amplifier 14.

The PFET (second transistor) 132a has a gate terminal (second gate terminal) G2 connected to the first write signal line 161, and the a source terminal (second source terminal) S2 connected to the drain terminal D1 of the PFET 131. A drain terminal (second drain terminal) D2 of the PFET 132a is connected to a source terminal S3 of the PFET 133. The PFET 132a outputs, from the drain terminal D2 thereof, the read signal (first read signal) inputted from the source terminal S1 of the PFET 131.

In the PFET 132a, when the first driving write signal PDIT is inputted from the source terminal S1 (first source terminal) of the PFET 131, the PFET 132a inhibits the first driving write signal PDIT from being outputted from the drain terminal D2 thereof on the basis of the write signal DIT inputted from the gate terminal G2 (gate terminal G1; first gate terminal) thereof.

In concrete, when "1" (High pulse) is inputted as the write signal DIT from the first write signal line 161 to the gate terminal G2 of the PFET 132a, the PFET 132a inhibits the signal from being outputted from the drain terminal D2 thereof.

In other words, in the memory circuit 1a of the first embodiment, the PFET 132a (inhibit circuit) whose gate is connected the first write signal line 161 is provided between the column selector (not shown) and a GBL driver unit (to be described later) of the GBL driver 13a.

The PFET (third transistor) 133 has a gate terminal (third gate terminal) G3 connected to the column signal line 164, and the source terminal (third source terminal) S3 connected to the drain terminal D2 of the PFET 132a. A drain terminal (third drain terminal) D3 of the PFET 133 is connected to a drain terminal D4 of the NFET 134, a drain terminal D5 of the NFET 135 and a gate terminal G6 of the NFET 136.

When the memory cell 10 associated with the PFET 133 is not selected, the PFET 133 inhibits the read signal inputted from the source terminal S1 of the PFET 131 or the first driving write signal PDIT generated by the write amplifier 14 from being outputted from the drain terminal D3 thereof on the basis of the column signal CSEL inputted from the gate terminal G3 thereof.

In concrete, when "1" is inputted as the column signal CSEL to the gate terminal G3 of the PFET 133 from the column signal line 164, the PFET 133 inhibits the signal from being outputted from the drain terminal D3 thereof.

The NFET 134 has a gate terminal G4 connected to the pre-discharge signal line 163, the drain terminal D4 connected to the drain terminal D3 of the PFET 133, and a source terminal S4 grounded.

The NFET 135 has a gate terminal G5 connected to the global line GBL, the drain terminal D5 connected to the drain terminal D3 of the PFET 133, a the source terminal S5 grounded.

The NFET 136 has a gate terminal G6 connected to the drain terminal D3 of the PFET 133, a drain terminal D6 connected to the global signal line GBL, and a source terminal S6 grounded.

In the memory circuit 1a of the first embodiment, the NFETS 135 and 136 output the read signal or the first driving signal PDIT inputted from the gate terminal G6 of the NFET 136 to the global signal line GBL, the NFETs 135 and 136 together functioning as the GBL driver unit (output circuit).

The global signal generated by the GBL driver 13a is outputted from the global signal line GBL, captured in a latch 173, and outputted by the I/O circuit 201 or the like to the outside of the memory circuit 1a.

Next, the process performed at the time of data writing in the memory circuit 1a according to the first embodiment of the memory circuit and the control method thereof configured as above will be described with reference to a timing chart shown in FIG. 5.

At the timing of rising of a system clock CLK (refer to point A0 in FIG. 5), the write enable signal WE and the input signal DI are captured in the latches, respectively (cycle 1).

"0" is inputted as the write enable signal WE to the write driver 15 through the write enable signal 169 (refer to point A1 in FIG. 5), whereby the memory circuit 1a of the first embodiment is set to the write mode.

When the pulsed clock signal WCK is inputted to the write driver 15 (refer to point A3 in FIG. 5) with "1" inputted as the input signal DI through the data input signal line 168 (refer to point A2 in FIG. 5), the write driver 15 generates the write signal DIT ("0") and the write signal DIC ("1"; positive pulse, High pulse) which is a complementary signal thereof.

Figure 5:
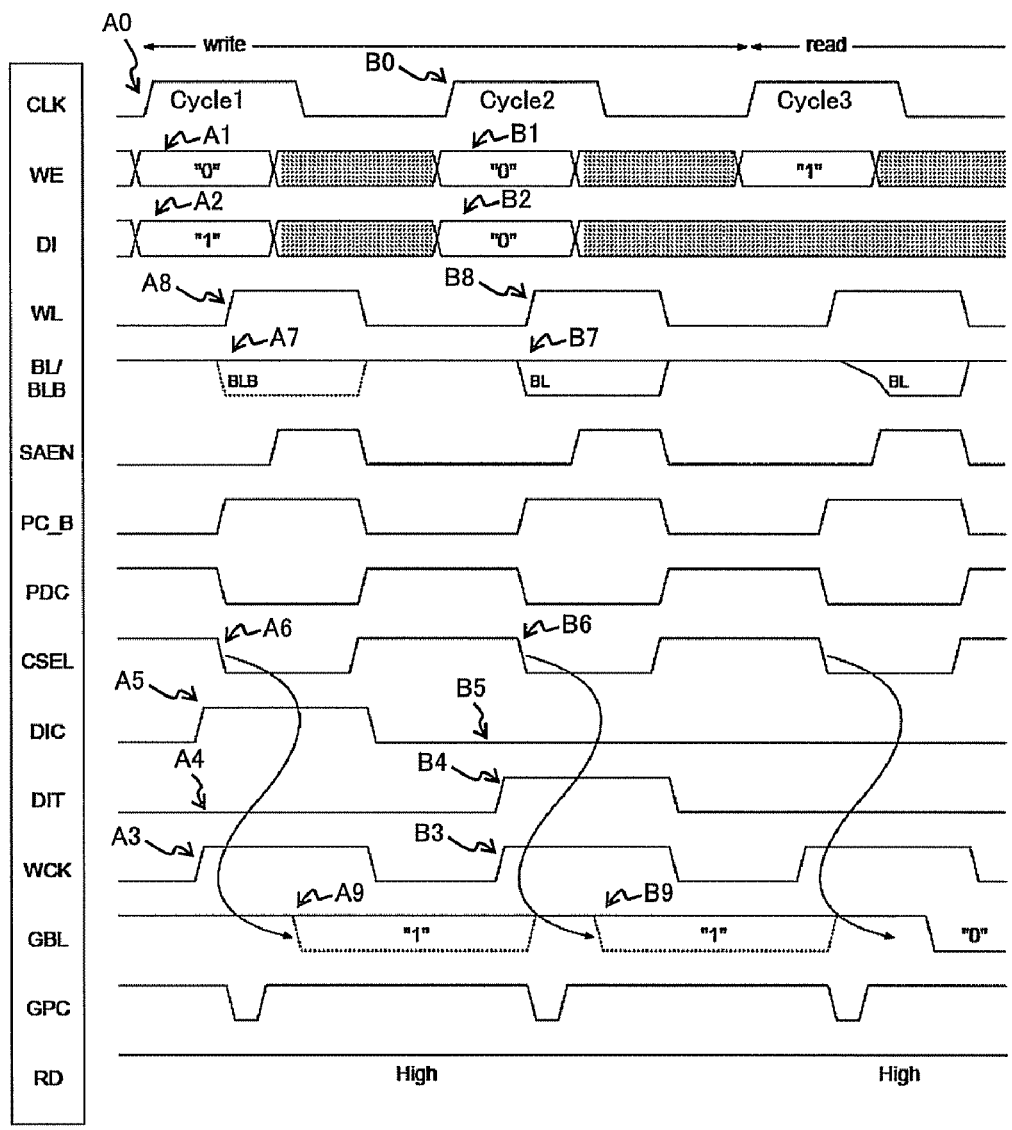
FIG. 5 is a timing chart for illustrating a process at the time of data writing in the memory circuit according to the first embodiment.

The write driver 15 outputs the generated write signal DIT ("0") from the first write signal line 161 (refer to point A4 in FIG. 5), while outputting the generated write signal DIC ("1") from the second write signal line 162 (refer to point A5 in FIG. 5).

When the column signal CSEL ("0") is inputted from the column signal line 164 (refer to point A6 in FIG. 5), in the selected column, "1" is inputted to the gate terminal of the transistor 141 in the write amplifier 14 on the basis of the column signal "0", while "1" is inputted to the gate terminal of the transistor 144.

Whereby, "1" is set to the local bit line BL, while "0" is set to the local bit line BLB (refer to point A7 in FIG. 5). Namely, the local bit line BLB is discharged.

The local bit line BLB is discharged, later, the word line WL becomes "1" (refer to point A8 in FIG. 5), and data is written in the memory cell 10.

Because of inputting of the column signal CSEL ("0"), a bit line pre-charge signal PC_B ("1"), a pre-discharge signal PDC (1"0"1), a global bit line pre-charge signal GPC ("0") and the sense amplifier enable signal SAEN are inputted.

The local bit lines BL and BLB are pre-charged by the bit line pre-charge signal PC_B. The global bit line GBL is pre-charged by the global bit line pre-charge signal GPC to a VDD level in each cycle.

The global bit line keeps "1" (refer to point A9 in FIG. 5).

At the timing of rising of the next system clock CLK (refer to point B0 in FIG. 5), the write enable signal WE and the input signal DI are captured in the latches (cycle 2).

"0" is inputted as the write enable signal WE to the write driver 15 through the write enable signal line 169 (refer to point B1 in FIG. 5), "0" is inputted as the input signal DI through the data input signal line 168 in a state where the memory circuit 1a of this embodiment is set to the write mode (refer to point B2 in FIG. 5).

When the pulsed clock signal WCK is inputted in this state (refer to point B3 in FIG. 5), the write driver 15 generates the write signal DIT ("1"; positive pulse, High pulse) and the write signal DIC ("0") which is a complementary signal thereof.

The write driver 15 outputs the generated write signal DIT ("1") from the first write signal line 161 (refer to point B4 in FIG. 5), and outputs the generated write signal DIC ("0") from the second write signal line 162 (refer to point B5 in FIG. 5).

When the column signal CSEL ("0") is inputted from the column signal line 164 (refer to point B6 in FIG. 5), in the selected column, "1" is inputted to the gate terminal of the transistor 142 and "1" is inputted to the gate terminal of the transistor 144 in the write amplifier 14 on the basis of the column signal "0".

Whereby, "0" is set to the local bit line BL, whereas "1" is set to the local bit line BLB (refer to point B7 in FIG. 5). Namely, the local bit line BL is discharged.

The local bit line BL is discharged, later, the word line WL becomes "1" (refer to point B8 in FIG. 5), and data is written in the memory cell 10.

Because of the column signal CSEL ("0"), the bit line pre-charge signal PC_B ("1"), the pre-discharge signal PDC ("0"), the global bit line pre-charge signal GPC ("0") and the sense amplifier enable signal SEAN are inputted.

The local bit lines BL and BLB are pre-charged by the bit line pre-charge signal PC_B, and the global bit line GBL is pre-charged by the global bit line pre-charge signal GPC to the VDD level in each cycle.

In the GBL driver 13a, the write signal DIT ("1") is inputted to the gate terminal G2 of the PFET 132a from the first write signal line 161, thereby to inhibit the signal from being outputted from the drain terminal D2 of the PFET 132a.

Namely, in the data writing operation, in the GBL driver 13a, the circuit from the local bit line BL to the global bit line GBL is shut off, whereby the "1" signal in the global bit line GBL is prevented from being discharged, hence the global bit line GBL keeps "1" (refer to point B9 in FIG. 5).

In the memory circuit 1a according to the first embodiment of the memory circuit and the control method thereof, the write signal DIT controls itself not to be outputted to the global signal line GBL in the data writing (write mode).

In the memory circuit 1a of the first embodiment, in the data reading (read mode), since "0" is outputted as the write signal DIT from the write driver 15 to the first write signal line 161 as shown in FIG. 4, "0" is inputted to the gate terminal G2 of the PFET 132a in the GBL driver 13a, hence the PFET 132a does not assert an effect on the operation of the GBL driver 13a.

As stated above, in the memory circuit 1a according to the first embodiment of the memory circuit and the control method thereof, a circuit from the local bit line BL to the global bit line GBL is shut off in the data writing (write mode), hence the write signal DIT (input signal) is not outputted to the output terminal through the global bit line GBL, which is effective to reduce the power consumption.

By using the output (write signal DIT) of the write driver 15 for the control without a change, it becomes unnecessary to provide a new wiring channel, which suppresses an increase in number of the elements excepting those in the read/write block 200, and decreases the area overhead.

In the GBL driver 13a, the three PFETs 131, 132a and 133 are connected in series in three stages to reduce the mounting area.

(B) Second Embodiment

Figure 6:
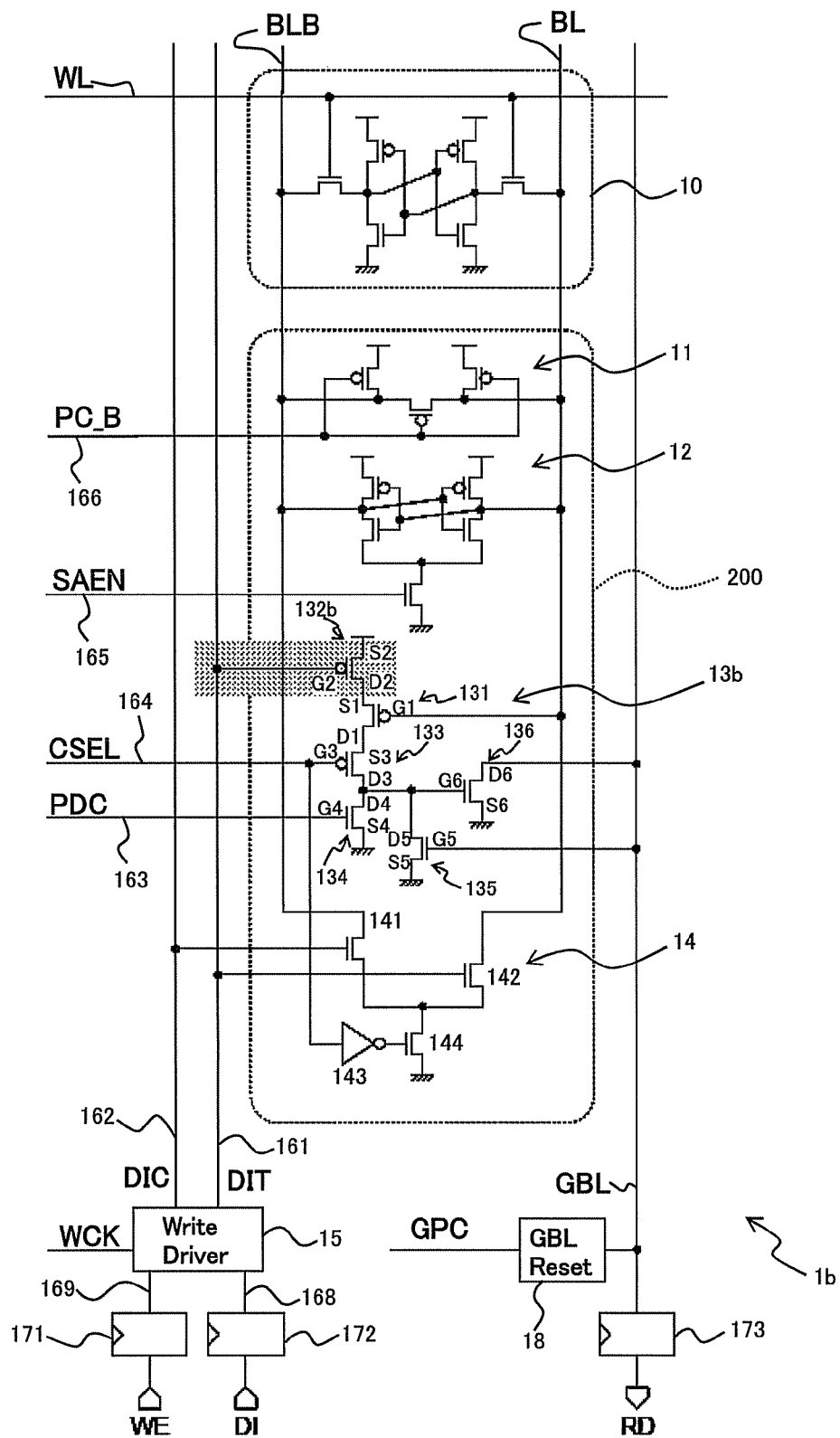
FIG. 6 is a diagram showing an example of part of circuit configuration of a memory circuit according to a second embodiment.

FIG. 6 is a diagram showing an example of part of circuit configuration of a memory circuit 1b according to a second embodiment of the memory circuit and the control method thereof.

Like the memory circuit 1a according to the first embodiment, the memory circuit 1b according to the second embodiment readably stores data in an SRAM or the like. As shown in FIG. 6, the memory circuit 1b has a GBL driver 13b instead of the GBL driver 13a, other parts being similar to those of the memory circuit 1a according to the first embodiment.

Incidentally, like reference characters in the drawings designate like or corresponding parts, detailed descriptions of which are thus omitted.

Like the GBL driver 13a of the first embodiment, the GBL driver 13b sends out the read signal read out from the memory cell 10 and amplified by the sense amplifier 12 to the global signal line GBL, and sends out the write signal inputted from the write driver 15 and amplified by the write amplifier 14 to the local bit lines BL and BLB.

To the GBL driver 13b, connected are the column signal line 164, the pre-discharge signal line 163, the local bit lines BL and BLB, and the first write signal line 161. When the read signal (first read signal) read out from the memory cell 10 and amplified by the sense amplifier 12 is inputted from the local bit line BL with the column signal CSEL being inputted from the column signal line 164, the GBL driver 13b outputs the inputted read signal as a global signal from the global bit line GBL.

The GBL driver 13b has a function as a column switch which controls to output the read signal in the local bit line BL to the global bit line GBL on the basis of the column signal CSEL inputted from the column bit line 164 at the time of the data reading operation of the memory circuit 1b of the second embodiment.

Further, to the GBL driver 13a, inputted is the write signal DIT from the first write signal line 161. When the write signal DIT is inputted from the first write signal line 161, the GBL driver 13b inhibits the first driving write signal PDIT generated by the write amplifier 14 from being outputted to the global signal line GBL on the basis of the write signal DIT.

The GBL driver 13b has a PFET 132b whose source terminal is connected to a power source, instead of the PFET 132a in the GBL driver 13a of the first embodiment.

In concrete, as shown in FIG. 6, the GBL driver 13b has PFETs (p-type FET (Field effect transistor)) 131, 132b and 133, and NFETs (n-type FET) 134, 135 and 136.

The PFET (first transistor) 131 has a gate terminal (first gate terminal) G1 connected to the local bit line BL, and a source terminal (first source terminal) S1 connected to a drain terminal D2 of the PFET 132b. A drain terminal (first drain terminal) D1 of the PFET 131 is connected to a source terminal S3 of the PFET 133.

The PFET 131 outputs, from the drain terminal D1 thereof, the read signal (first read signal) inputted from the local bit line BL and the first driving write signal PDIT generated by the write amplifier 14.

The PFET (second transistor) 132b has a gate terminal (second gate terminal) G2 connected to the first write signal line 161, and a source terminal (second source terminal) S2 connected to a power source. A drain terminal (second drain terminal) D2 of the PFET 132b is connected to the source terminal S1 of the PFET 131.

The PFET 132b outputs, from the drain terminal D2 thereof, the read signal (first read signal) inputted from the source terminal S1 of the PFET 131.

When the first driving write signal PDIT is inputted from the source terminal S1 (first source terminal) of the PFET 131 to the PFET 132b, the PFET 132b inhibits the first driving write signal PDIT from being outputted from the drain terminal D2 thereof on the basis of the write signal DIT inputted from a gate terminal G2 (gate terminal G1; first gate terminal) thereof.

When "0" is inputted as the write signal DIT from the first write signal line 161, the PFET 132b outputs an electric power signal from the drain terminal D2 thereof. When "1" is inputted as the write signal DIT from the first write signal line 161, the PFET 132b inhibits the electric power signal supplied from the power source connected to the source terminal S2 thereof from being outputted from the drain terminal D2 thereof, thereby to shut off the power source route of the transistors connected to the downstream from the drain terminal D2 of the PFET 132b.

In concrete, when "1" (High pulse) is inputted as the write signal DIT from the first write signal line 161 to the gate terminal G2 of the PFET 132b, the PFET 132b inhibits the signal from being outputted from the drain terminal D2 thereof.

Namely, in the memory circuit 1b of the second embodiment, the PFET 132b (inhibit circuit) whose gate terminal is connected to the first write signal line 161 is disposed between the column selector (not shown) and the GBL driver unit of the GBL driver 13b.

The PFET (third transistor) 133 has a gate terminal (third gate terminal) G3 connected to the column signal line 164, and a source terminal (third source terminal) S3 connected to the drain terminal D1 of the PFET 131. A drain terminal (third drain terminal) D3 of the PFET 133 is connected to a drain terminal D4 of the NFET 134, a drain terminal D5 of the NEFT 135 and a gate terminal G6 of the NFET 136.

When the memory cell 10 associated with the PFET 133 is not selected, the PFET 133 inhibits the read signal inputted from the source terminal S1 of the PFET 131 or the first driving write signal PDIT generated by the write amplifier 14 from being outputted from the drain terminal D3 thereof on the basis of the column signal CSEL inputted from the gate terminal G3 thereof.

In concrete, when "1" is inputted as the column signal CSEL from the column signal line 164 to the gate terminal G3 of the PFET 133, the PFET 133 inhibits the signal from being outputted from the drain terminal D3 thereof.

The NFET 134 has a gate terminal G4 connected to the pre-discharge signal line 163, and the drain terminal D4 connected to the drain terminal D3 of the PFET 133. A source terminal S4 of the NFET 134 is grounded.

The NFET 135 has a gate terminal G5 connected to the global signal line GBL, the drain terminal D5 connected to the drain terminal D3 of the PFET 133, and a source terminal S5 grounded.

The NFET 136 has a gate terminal G6 connected to the drain terminal D3 of the PFET 133, a drain terminal D6 connected to the global signal line GBL, and a source terminal S6 grounded.

In the memory circuit 1b of the second embodiment, the NFETs 135 and 136 output the read signal or the first driving write signal PDIT inputted from the gate terminal G6 of the NEFT 136 to the global signal line GBL. These NFETs 135 and 136 together function as a GBL driver unit (output circuit).

The global signal generated by the GBL driver 13b is outputted from the global signal line GBL, captured in the latch 173, and outputted from the I/O circuit 201 or the like to the outside of the memory circuit 1b.

In the memory circuit 1b according to the second embodiment of the memory circuit and the control method thereof, the write driver 15 generates the write signals DIT and DIC on the basis of the pulsed clock WCK, the write enable signal WE and the input signal DI in the data writing operation.

When the write driver 15 outputs "1" as the write signal DIT, the write signal DIT ("1") is inputted to the gate terminal G2 of the PFET 132b to inhibit the signal from being outputted from the drain terminal D2 of the PFET 132b.

Whereby, in the GBL driver 13b, a circuit from the local bit line BL to the global bit line GBL is shut off. Accordingly, the "1" signal in the global bit line GBL is not discharged, hence the global bit line GBL keeps "1" (refer to point B9 in FIG. 5).

As stated above, in the memory circuit 1b according to the second embodiment of the memory circuit and the control method thereof, in the data writing (write mode), a circuit from the local bit line BL to the global bit line GBL is shut off so that the write signal DIT (input signal) is not outputted to the output terminal through the global bit line GBL, which reduces the power consumption.

By using the output (write signal DIT) of the write driver 15 without a change, it becomes unnecessary to provide a new wiring channel, which can suppress an increase in number of elements other than those in the read/write block 200 and decrease the area overhead.

(C) Third Embodiment

Figure 7:
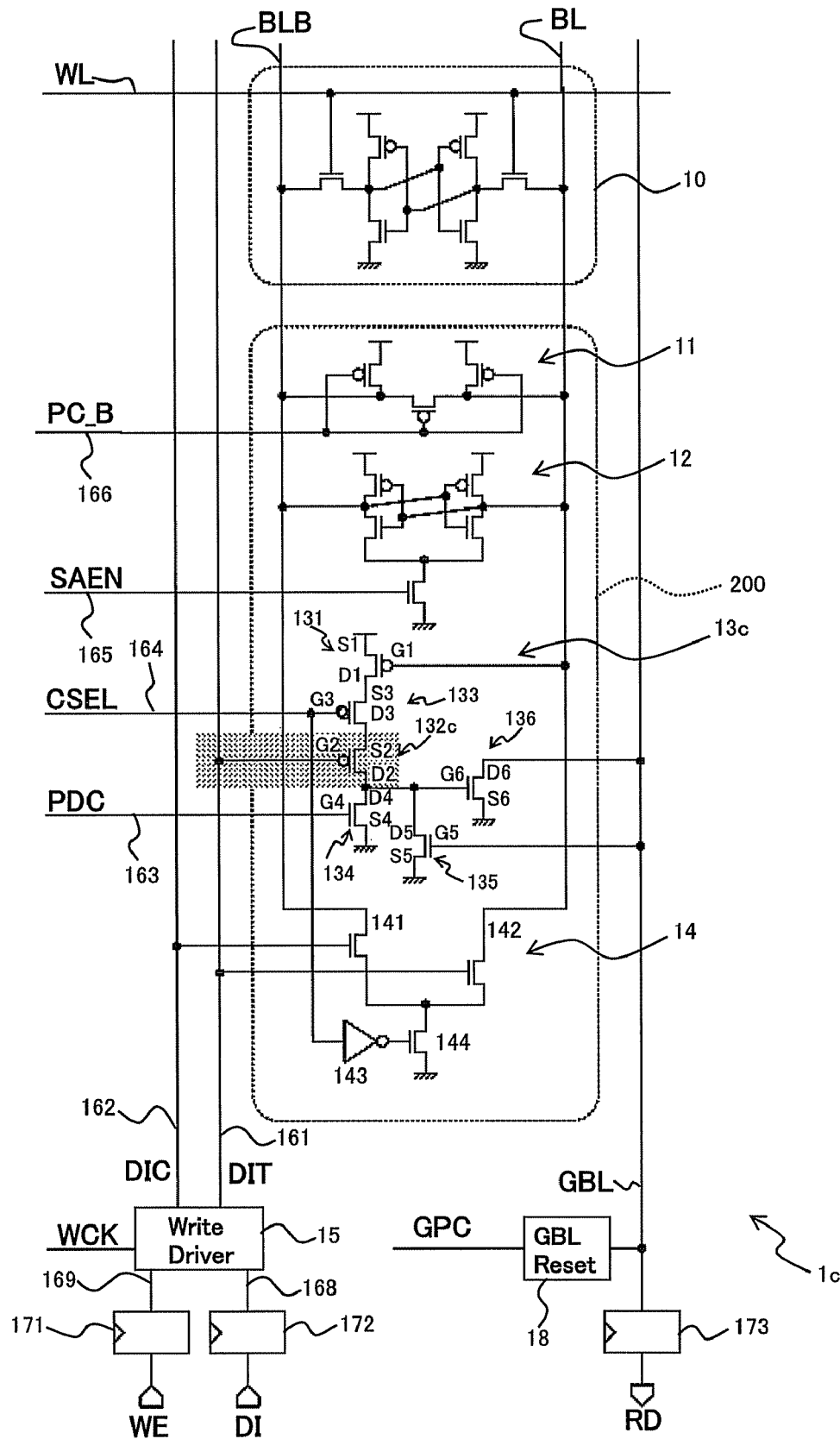
FIG. 7 is a diagram showing an example of part of circuit configuration of a memory circuit according to a third embodiment.

FIG. 7 is a diagram showing an example of part of circuit configuration of a memory circuit 1c according to a third embodiment of the memory circuit and the control method thereof.

Like the memory circuit 1a according to the first embodiment, the memory circuit 1c according to the third embodiment readably stores data in an SRAM or the like. As shown in FIG. 7, the memory circuit 1c has a GBL driver 13c instead of the GBL driver 13a of the first embodiment, other parts being similar to those of the memory circuit 1a of the first embodiment.

Incidentally, like reference characters designate like or corresponding parts in the drawings, detailed descriptions of which are thus omitted.

Like the GBL driver 13a of the first embodiment, the GBL driver 13c sends out the read signal read out from the memory cell 10 and amplified by the sense amplifier 12 to the global signal line GBL, and sends out the write signal inputted from the write driver 15 and amplified by the write amplifier 14 to the local bit lines BL and BLB.

To the GBL driver 13c, connected are the column signal line 164, the pre-discharge signal line 163, the local bit lines BL and BLB, and the first write signal line 161. When the read signal (first read signal) read out from the memory cell 10 and amplified by the sense amplifier 12 is inputted from the local bit line BL with the column signal CSEL being inputted from the column signal line 164, the GBL driver 13c outputs the inputted read signal as the global signal from the global signal line GBL.

The GBL driver 13c has a function as a column switch which performs a control to output the read signal in the local bit line BL to the global bit line GBL on the basis of the column signal CSEL inputted from the column signal line 164 in the data reading operation of the memory circuit 1c.

Further, the GBL driver 13c is inputted thereto the write signal DIT from the first write signal line 161. When the write signal DIT is inputted from the first write signal line 161, the GBL driver 13c inhibits the first driving write signal PDIT generated by the write amplifier 14 from being outputted to the global signal line GBL on the basis of the write signal DIT.

The GBL driver 13c has a PFET 132c whose drain terminal is connected to the GBL driver unit, instead of the PFET 132a in the GBL driver 13a of the first embodiment.

In concrete, the GBL driver 13c has PFETs (p-type FET (Field effect transistor)) 131, 132c and 133, and NFETs (n-type FET) 134, 135 and 136, as shown in FIG. 7.

The PFET (first transistor) 131 has a gate terminal (first gate terminal) G1 connected to the local bit line BL, and a source terminal (first source terminal) S1 connected to a power source. A drain terminal (first drain terminal) D1 of the PFET 131 is connected to a source terminal S3 of the PFET 133.

The PFET 131 outputs, from the drain terminal D1 thereof, the read signal (first read signal) inputted from the local bit line BL and the first driving write signal PDIT generated by the write amplifier 14.

The PFET (second transistor) 132c has a gate terminal (second gate terminal) G2 connected to the first write signal line 161, and a source terminal (second source terminal) S2 connected to a drain terminal D3 of the PFET 133. A drain terminal (second drain terminal) D2 of the PFET 132c is connected to a drain terminal D4 of the NFET 134, a drain terminal D5 of the NFET 135 and a gate terminal G6 of the NFET 136.

The PFET 132c outputs, from the drain terminal D2 thereof, the read signal (first read signal) inputted from the source terminal S1 of the PFET 131.

When the first driving write signal PDIT is inputted from the source terminal S1 (first source terminal) S1 of the PFET 131, the PFET 132c inhibits the first driving write signal PDIT from being outputted from the drain terminal D2 thereof on the basis of the write signal DIT inputted from the gate terminal G2 (gate terminal G1; first gate terminal) thereof.

In concrete, when "1" is inputted as the write signal DIT from the first write signal line 161 to the gate terminal G2 of the PFET 132c, the PFET 132c inhibits the signal from being outputted from the drain terminal D2 thereof.

Namely, in the memory circuit 1c according to the third embodiment, the GBL driver 13c is provided with the PFET 132c (inhibit circuit) whose gate terminal is connected to the first write signal line 161.

The PFET (third transistor) 133 has a gate terminal (third gate terminal) G3 connected to the column signal line 164, and a source terminal (third source terminal) S3 connected to the drain terminal D1 of the PFET 131. A drain terminal (third drain terminal) D3 of the PFET 133 is connected to the source terminal S2 of the PFET 132c.

When the memory cell 10 associated with the PFET 133 is not selected, the PFET 133 inhibits the read signal inputted from the source terminal S1 of the PFET 131 or the first driving write signal PDIT generated by the write amplifier 14 from being outputted from the drain terminal D3 thereof on the basis of the column signal CSEL inputted to the gate terminal G3 thereof.

In concrete, when "1" is inputted as the column signal CSEL from the column signal line 164 to the gate terminal G3 of the PFET 133, the PFET 133 inhibits the signal from being outputted from the drain terminal D3 thereof.

The NFET 134 has a gate terminal G4 connected to the pre-discharge signal line 163, and a drain terminal D4 connected to the drain terminal D2 of the PFET 132c. A source terminal S4 of the NEFT 134 is grounded.

The NFET 135 has a gate terminal G5 connected to the global signal line GBL, and a drain terminal D5 connected to the drain terminal D2 of the PFET 132c. A source terminal S5 of the NFET 135 is grounded.

The NFET 136 has a gate terminal G6 connected to the drain terminal D2 of the PFET 132c, and a drain terminal D6 connected to the global signal line GBL. A source terminal S6 of the NFET 136 is grounded.

These NEFTs 134 to 136 together function as a GBL driver unit in the GBL driver 13c.

In the memory circuit 1c according to the third embodiment, the NFETs 135 and 136 output the read signal or the first driving write signal PDIT inputted from the gate terminal G6 of the NFET 136 to the global signal line GBL, these NFETs 135 and 136 functioning as the output circuit.

The global signal generated by the GBL driver 13c is outputted from the global signal line GBL, captured in the latch 173, and outputted from the I/O circuit 201 or the like to the outside of the memory circuit 1c.

In the memory circuit 1c according to the third embodiment of the memory circuit and the control method thereof, the write driver 15 generates the write signals DIT and DIC on the basis of the pulsed clock WCK, the write enable signal WE and the input signal DI in the data writing operation of the memory circuit 1c.

When the write driver 15 outputs "1" as the write signal DIT, the write signal DIT ("1") is inputted to the gate terminal G2 of the PFET 132c to inhibit the signal from being outputted from the drain terminal D2 of the same.

In the GBL driver 13c, a circuit from the local bit line BL to the global bit line GBL is shut off. Accordingly, the "1" signal in the global bit line GBL is not discharged, hence the global bit line GBL keeps "1" (refer to point B9 in FIG. 5).

As stated above, the memory circuit 1c according to the third embodiment of the memory circuit and the control method thereof can provide the same working effects as the above mentioned second embodiment.

(D) Fourth Embodiment

Figure 8:
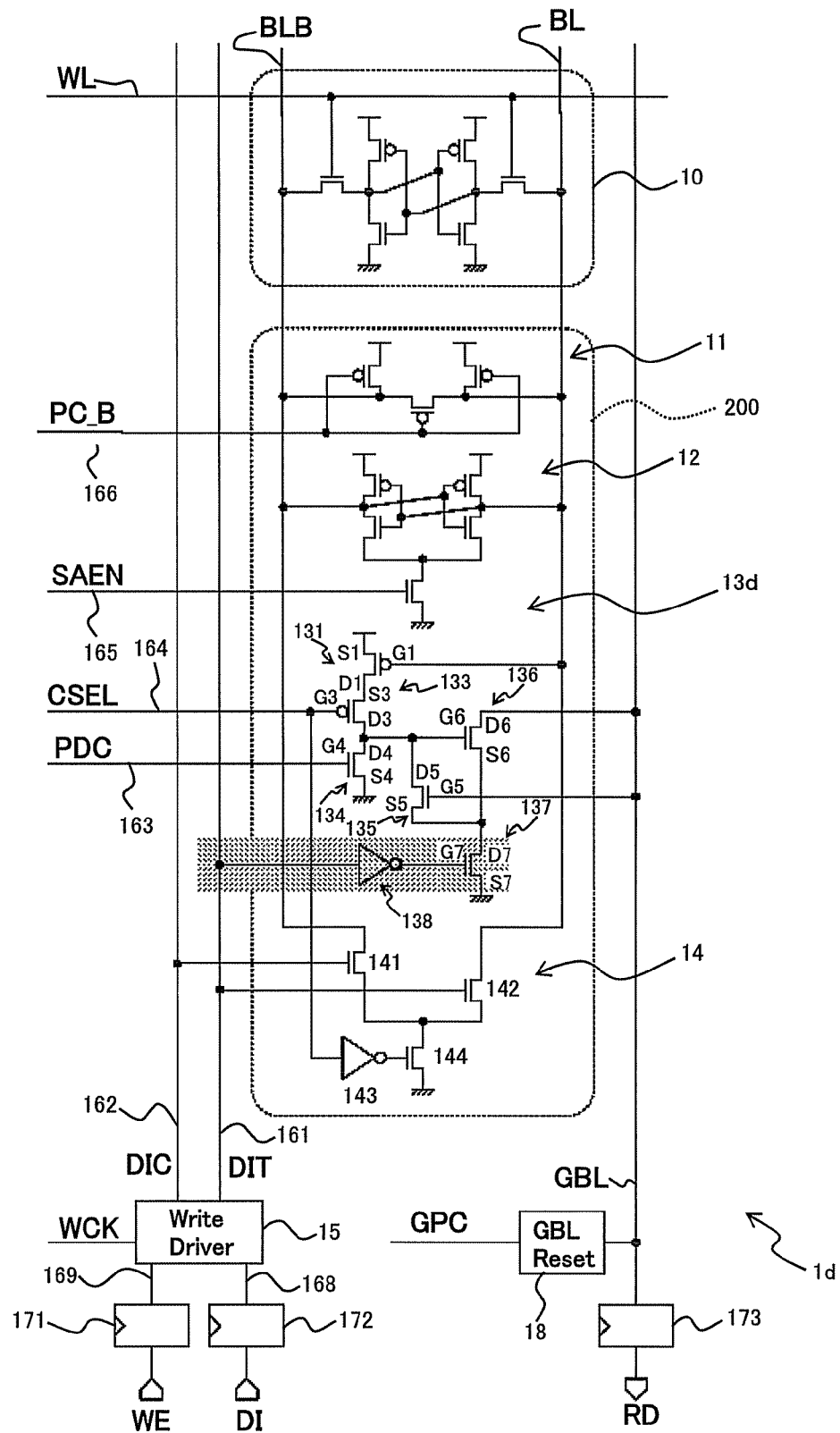
FIG. 8 is a diagram showing an example of part of circuit configuration of a memory circuit according to a fourth embodiment.

FIG. 8 is a diagram showing an example of part of circuit configuration of a memory circuit 1d according to a fourth embodiment of the memory circuit and the control method thereof.

Like the memory circuit 1a according to the first embodiment, the memory circuit 1d according to the fourth embodiment readably stores data in an SRAM or the like. As shown in FIG. 8, the memory circuit 1d has a GBL driver 13d instead of the GBL driver 13a of the first embodiment, other parts thereof being similar to those of the memory circuit 1a of the first embodiment.

Incidentally, like reference characters designate like or corresponding parts in the drawings, detailed descriptions of which are thus omitted.

Like the GBL driver 13a of the first embodiment, the GBL driver 13d sends out the read signal read out from the memory cell 10 and amplified by the sense amplifier 12 to the global bit line GBL, and sends out the write signal inputted from the write driver 15 and amplified by the write amplifier 14 to the local bit lines BL and BLB.

To the GBL driver 13d, connected are the column signal line 164, the pre-discharge signal line 163, the local bit lines BL and BLB and the first write signal line 161. When the read signal (first read signal) read out from the memory cell 10 and amplified by the sense amplifier 12 is inputted from the local bit line BL with the column signal CSEL being inputted from the column signal line 164, the GBL driver 13d outputs the inputted read signal as the global signal from the global signal line GBL.

The GBL driver 13d has a function as a column switch which performs a control to output the read signal in the local bit line BL to the global bit line GBL on the basis of the column signal CSEL inputted from the column signal line 164 in the data reading operation of the memory circuit 1d.

The GBL driver 13d is inputted thereto the write signal DIT from the first write signal line 161. When the write signal DIT is inputted from the first write signal line 161, the GBL driver 13d inhibits the first driving write signal PDIT generated by the write amplifier 14 from being outputted to the global signal line GBL on the basis of the write signal DIT.

The GBL driver 13d is provided with an NFET 137 between the GBL driving unit and GND (ground), instead of the PFET 132a in the GBL driver 13a of the first embodiment.

In concrete, as shown in FIG. 8, the GBL driver 13d has PFETs (p-type FET (Field effect transistor)) 131 and 133, NEFTs (n-type FET) 134, 135, 136 and 137, and an inverter 138.

The PFET (first transistor) 131 has a gate terminal (first gate terminal) G1 connected to the local bit line BL, and a source terminal (first source terminal) S1 connected to a power source. A drain terminal (first drain terminal) D1 of the PFET 131 is connected to a source terminal S3 of the PFET 133.

The PFET 131 outputs the read signal (first read signal) inputted from the local bit line BL and the first driving write signal PDIT (first driving write signal) generated by the write amplifier 14 from the drain terminal D1 thereof.

The PFET (second transistor) 133 has a gate terminal (second gate terminal) G3 connected to the column signal line 164, and a source terminal (second source terminal) S3 connected to the drain terminal D1 of the PFET 131. A drain terminal (second drain terminal) D3 of the PFET 133 is connected to a drain terminal D4 of the NFET 134, a drain terminal D5 of the NEFT 135 and a gate terminal G6 of the NFET 136.

When the memory cell 10 associated with the PFET 133 is not selected, the PFET 133 inhibits the read signal inputted from the source terminal S1 of the PFET 131 or the first driving write signal generated by the write amplifier 14 from being outputted from the drain terminal D3 thereof on the basis of the column signal CSEL inputted to the gate terminal G3 thereof.

In concrete, when "1" is inputted as the column signal CSEL from the column signal line 164 to the gate terminal G3 of the PFET 133, the PFET 133 inhibits the signal from being outputted from the drain terminal D3 thereof.

The NFET 134 has a gate terminal G4 connected to the pre-discharge signal line 163, and a drain terminal D4 connected to the drain terminal D3 of the PFET 133, the drain terminal D5 of the NEFT 135 and the gate terminal G6 of the NFET 136. A source terminal S4 of the NFET 134 is grounded.

The NFET (fourth transistor) 135 has the gate terminal (fourth gate terminal) G5 connected to the global signal line GBL, and a drain terminal (fourth source terminal) D5 connected to the drain terminal D3 of the PFET 133 and the gate terminal G6 of the NFET 136. A source terminal (fourth drain terminal) S5 of the NFET 135 is connected to a source terminal S6 of the NFET 136 and a drain terminal D7 of the NFET 137.

The NFET (third transistor) 136 has a gate terminal (third gate terminal) G6 connected to the drain terminal D3 of the PFET 133, and a drain terminal (third source terminal) D6 connected to the global signal line GBL. A source terminal (third drain terminal) S6 of the NFET 136 is connected to the drain terminal D7 of the NFET 137 and the source terminal S5 of the NFET 135.

In the memory circuit 1d according to the fourth embodiment, the NFETs 135 and 136 output the read signal (first read signal) or the first driving write signal PDIT (first driving write signal) inputted from the gate terminal G6 of the NFET 136 to the global signal line GBL. These NFETs 135 and 136 together function as a GBL driver unit (output circuit).

The inverter (inverter circuit) 138 is connected to the first write signal line 161 to invert the write signal DIT inputted from the first write signal 161.

The NFET (fifth transistor) 137 has a gate terminal (fifth gate terminal) G7 to which the inverted write signal DIT outputted from the inverter 138 is inputted, and the drain terminal (fifth source terminal) D7 connected to the source terminal S6 of the NFET 136 and the source terminal S5 of the NFET 135. A source terminal (fifth drain terminal) S7 of the NFET 137 is grounded.

When "1" (High pulse) is inputted as the write signal DIT from the first write signal line 161 to the inverter 138, the write signal DIT inverted by the inverter 138 is inputted to the gate terminal G7 of the NFET 137, and the NFET 137 inhibits the signal from being outputted from the source terminal S7 thereof.

Namely, in the memory circuit 1d of the fourth embodiment, the inverter 138 and the NFET 137 together function as an inhibit circuit which inhibits the first driving write signal PDIT fed from the NFETs 135 and 136 (output circuit) described above from being outputted to the global signal line GBL on the basis of the write signal DIT inputted through the first write signal line 161.

The global signal generated by the GBL driver 13d is outputted from the global signal line GBL, captured in the latch 173, and outputted from the I/O circuit 201 or the like to the outside of the memory circuit 1a.

In the memory circuit 1d according to the fourth embodiment of the memory circuit and the control method thereof, the write driver 15 generates the write signals DIT and DIC on the basis of the pulsed clock WCK, the write enable signal WE and the input signal DI in the data writing operation.

When the write driver 15 outputs "1" as the write signal DIT, the write signal DIT is inputted to the inverter 138, and the write signal DIT ("0") inverted by the inverter 138 is inputted to the gate terminal G7 of the NFET 137. The NFET 137 inhibits the signal from being outputted from the source terminal S7 thereof, hence a circuit from the local bit line BL to the global bit line GBL is shut off in the GBL driver 13d.

As stated above, the memory circuit 1d according to the fourth embodiment of the memory circuit and the control method thereof can provide the same working effects as the second embodiment described above. The memory circuit 1d according to the fourth embodiment can have a smaller delay penalty than the memory circuits 1a to 1c according to the above-described first to third embodiments.

(E) Fifth Embodiment

Figure 9:
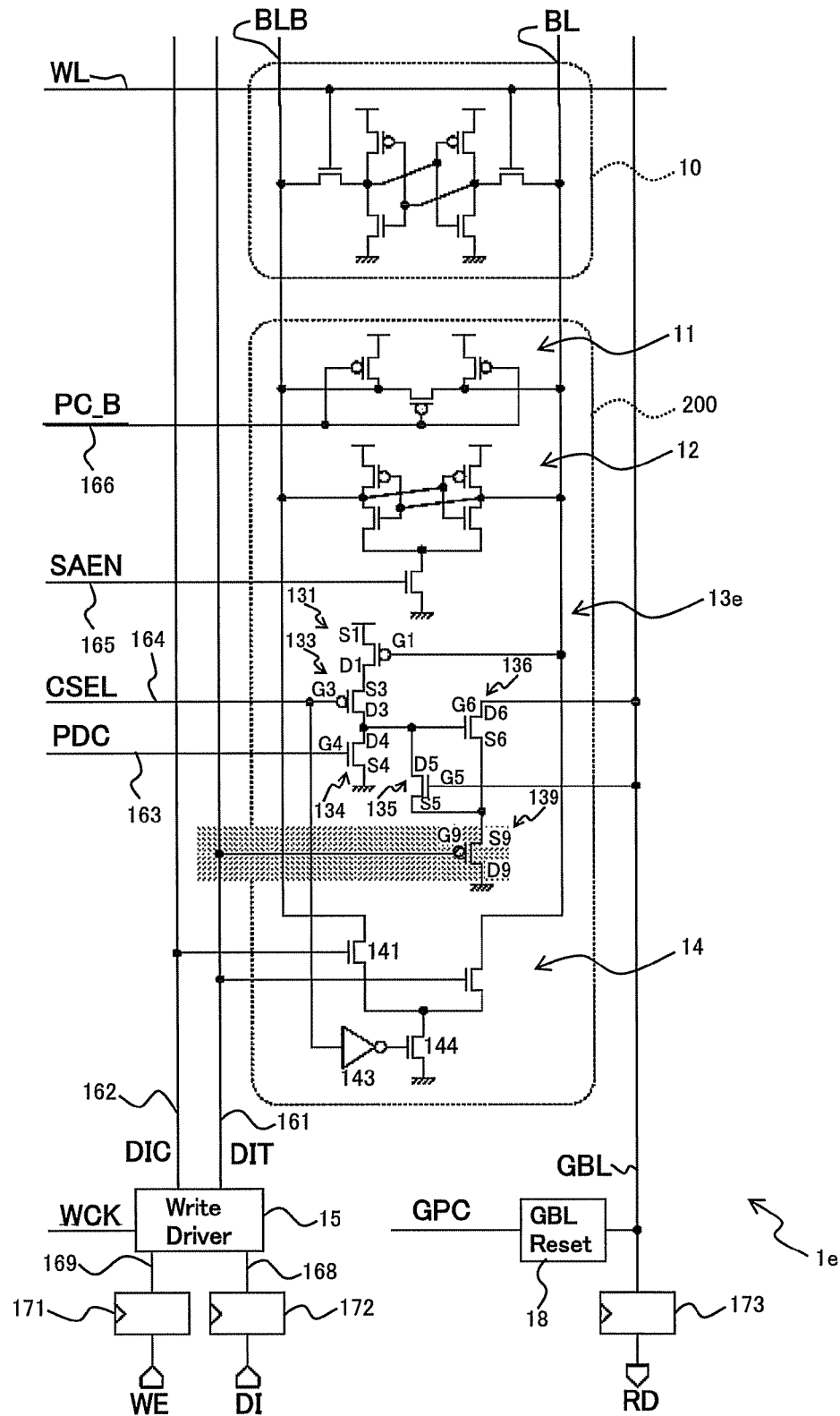
FIG. 9 is a diagram showing an example of part of circuit configuration of a memory circuit according to a fifth embodiment.

FIG. 9 is a diagram showing an example of part of circuit configuration of a memory circuit 1e according to a fifth embodiment of the memory circuit and the control method thereof.

Like the memory circuit 1d according to the fourth embodiment, the memory circuit 1e according to the fifth embodiment readably stores data in an SRAM or the like. As shown in FIG. 9, the memory circuit 1e has a GBL driver 13e instead of the GBL driver 13d of the fourth embodiment. Other parts are similar to those of the memory circuit 1d of the fourth embodiment.

Incidentally, like reference characters designate like or corresponding parts in the drawings, detailed descriptions of which are omitted.

Like the GBL driver 13d of the fourth embodiment, the GBL driver 13e sends out the read signal read out from the memory cell 10 and amplified by the sense amplifier 12 to the global signal line GBL, and the write signal inputted from the write driver 15 and amplified by the write amplifier 14 to the local bit lines BL and BLB. The GBL driver 13e has a PFET 139 instead of the inverter 138 and the NFET 137 of the GBL driver 13d of the fourth embodiment.

In concrete, the PFET 139 has a gate terminal G9 connected to the first write signal line 161, and a drain terminal D9 connected to the source terminal S5 of the NFET 135 and the source terminal S6 of the NFET 136. A source terminal S9 of the PFET 193 is grounded.

When "1" (High pulse) is inputted as the write signal DIT from the first write signal line 161 to the gate terminal G9 of the PFET 139, the PFET 139 inhibits the signal from being outputted from the drain terminal D9 thereof.

Namely, in the memory circuit 1e of the fifth embodiment, the PFET 139 functions as an inhibit circuit which inhibits the first driving write signal PDIT fed from the NFETs 135 and 136 (output circuits) described above from being outputted to the global signal line GBL on the basis of the write signal DIT inputted from the first write signal line 161.

In the memory circuit 1e according to the fifth embodiment of the memory circuit and the control method thereof, the write driver 15 generates the write signals DIT and DIC on the basis of the pulsed clock WCK, the write enable signal WE and the input signal DI in the data writing operation.

When the write driver 15 outputs "1" as the write signal DIT, the write signal DIT is inputted to the gate terminal G9 of the PFET 139. The PFET 139 inhibits the signal from being outputted from the source terminal S9 thereof, whereby a circuit from the local bit line BL to the global bit line GBL is shut off in the GBL driver 13d.

As above, the memory circuit 1e according to the fifth embodiment of the memory circuit and the control method thereof can provide the same working effects as the above-described fourth embodiment. Further, the memory circuit 1e of the fifth embodiment can be configured with a reduced wiring area as compared with the memory circuit 1d of the above-mentioned fourth embodiment.

(F) Others

Note that the memory circuit and the control method thereof are not limited to the above embodiments, but may be modified in various ways without departing from the scope and spirit of the invention.

For example, configurations of the memory cell 10, the pre-charge/equalizer 11, the sense amplifier 12 and the write amplifier 14 in the above embodiments are not limited to the examples shown in the drawings, but may be modified in various ways.

The disclosure of the embodiments of the memory circuit and the control method thereof enables a person skilled in the art to implement and fabricate the memory circuit and the control method thereof.

Figure 10:
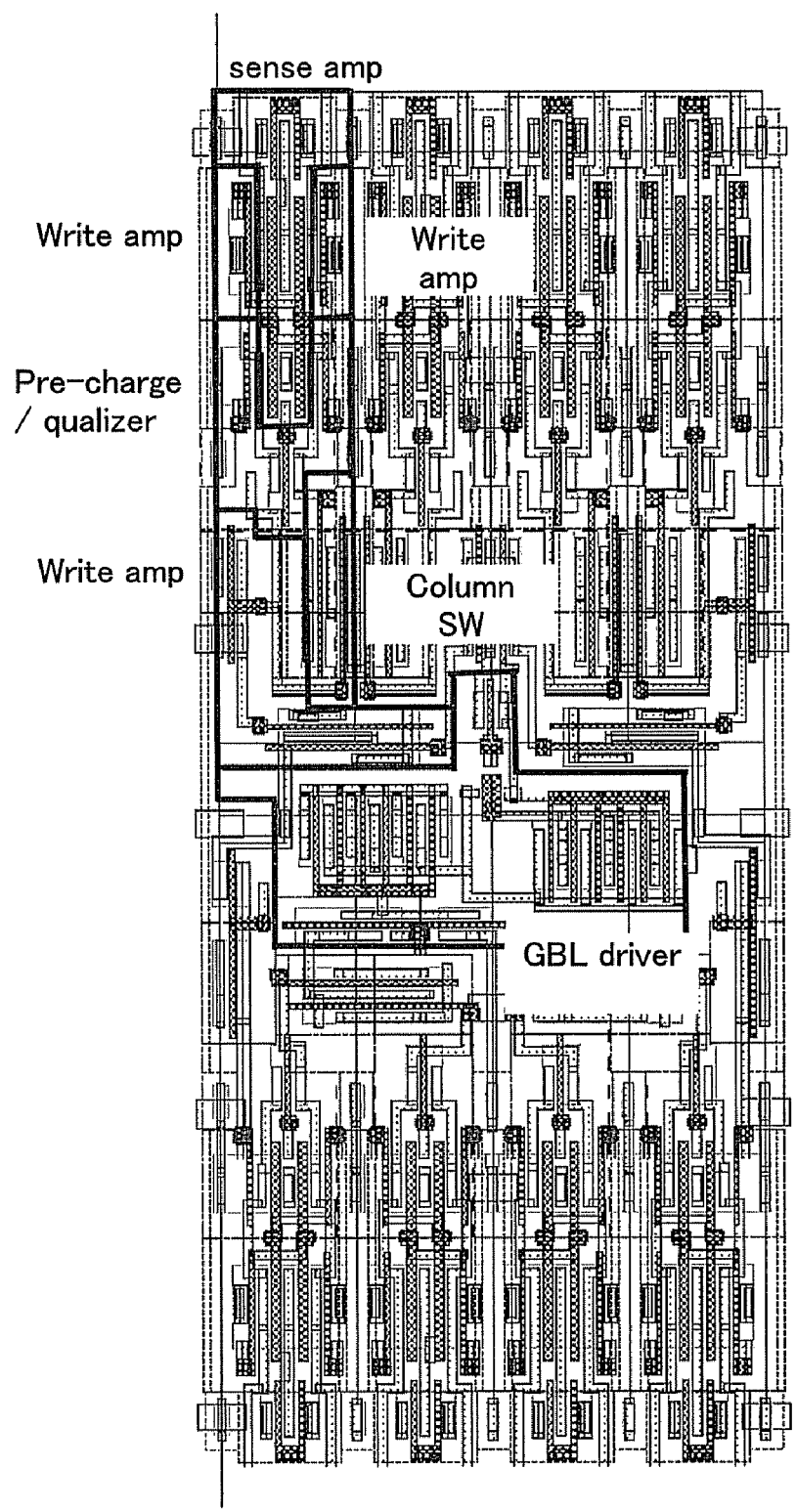
FIG. 10 is a diagram showing an example of circuit layout of the memory circuit according to the fourth embodiment.
Figure 11:
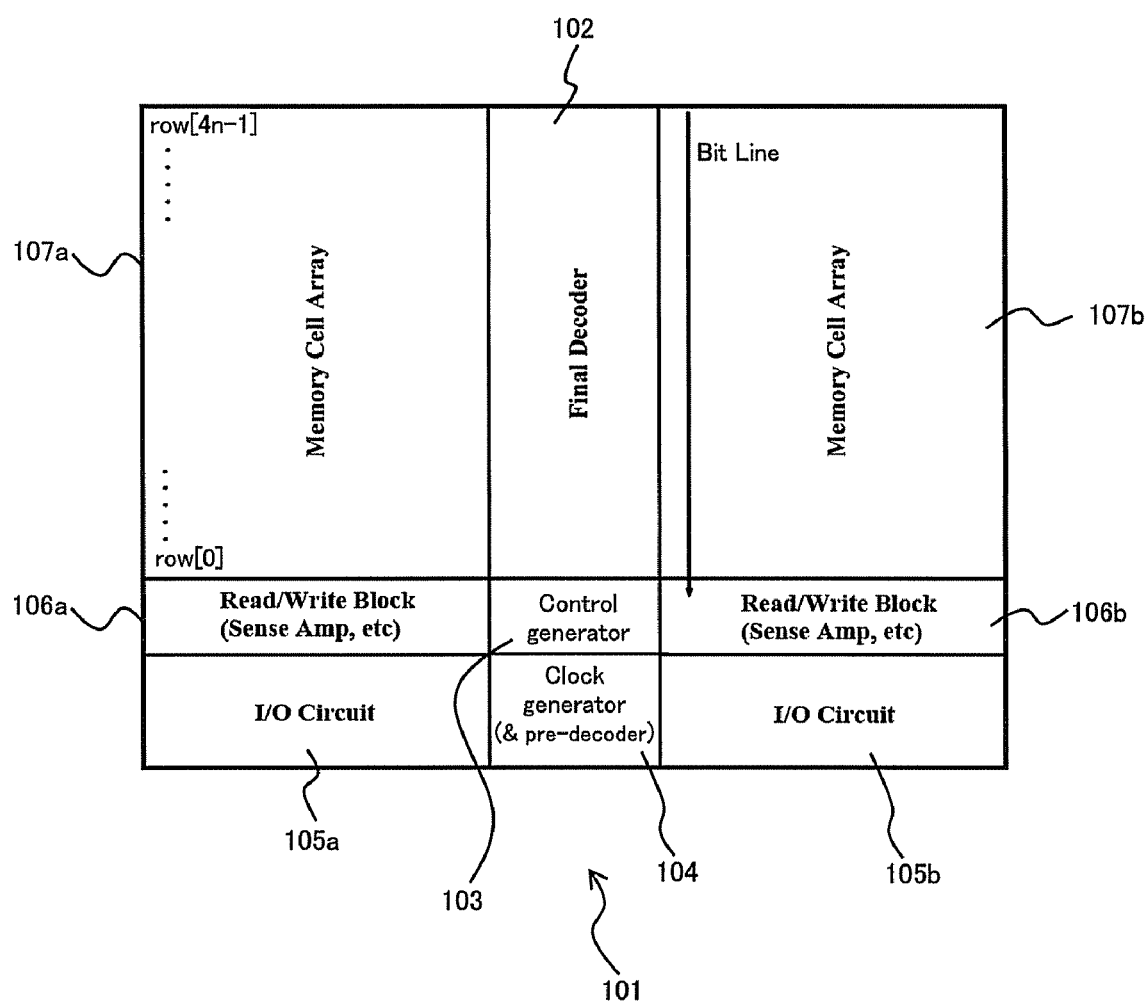
FIG. 11 is a diagram schematically showing configuration of a known SRAM.
Figure 12:
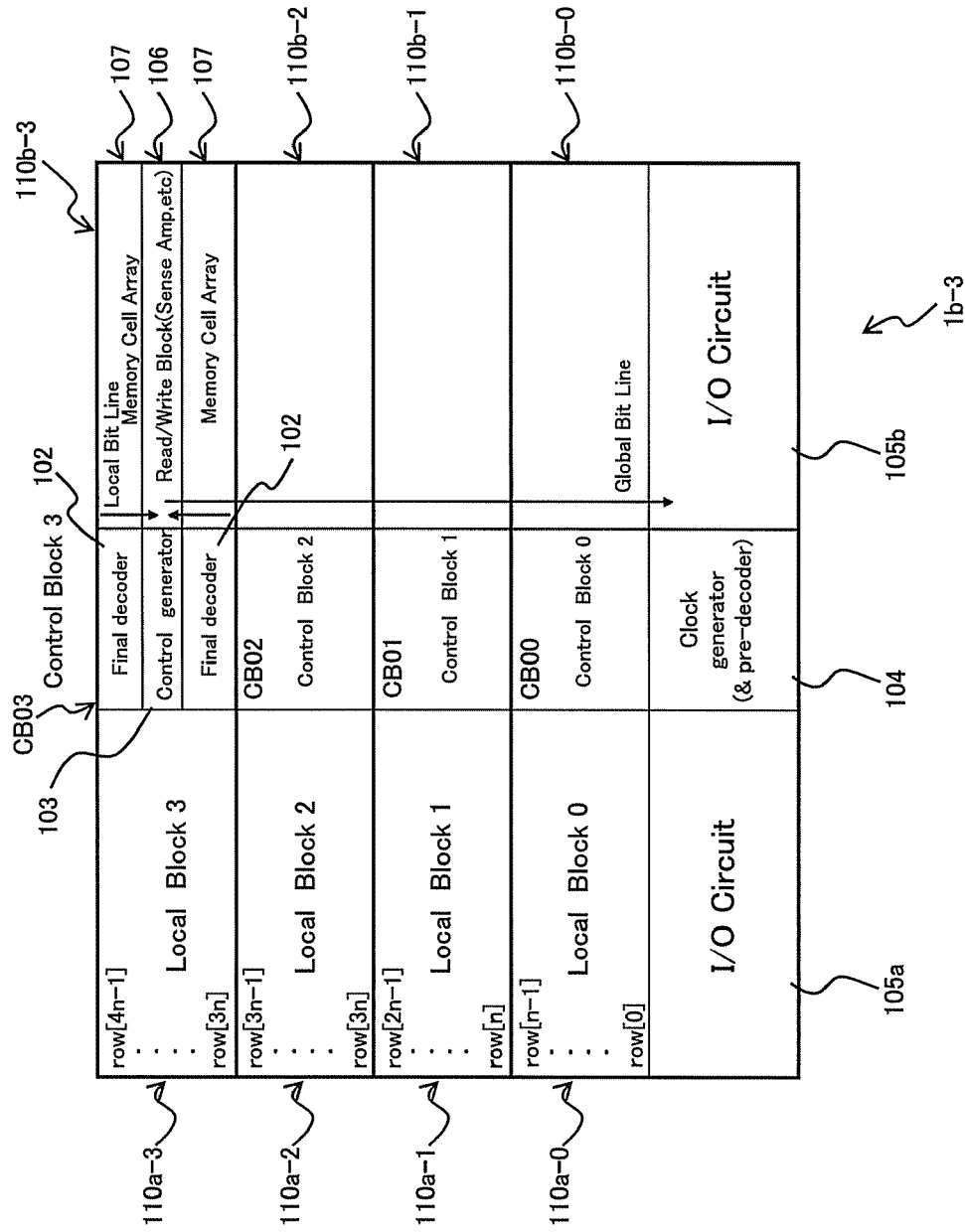
FIG. 12 is a diagram schematically showing configuration of another known SRAM.
Figure 13:
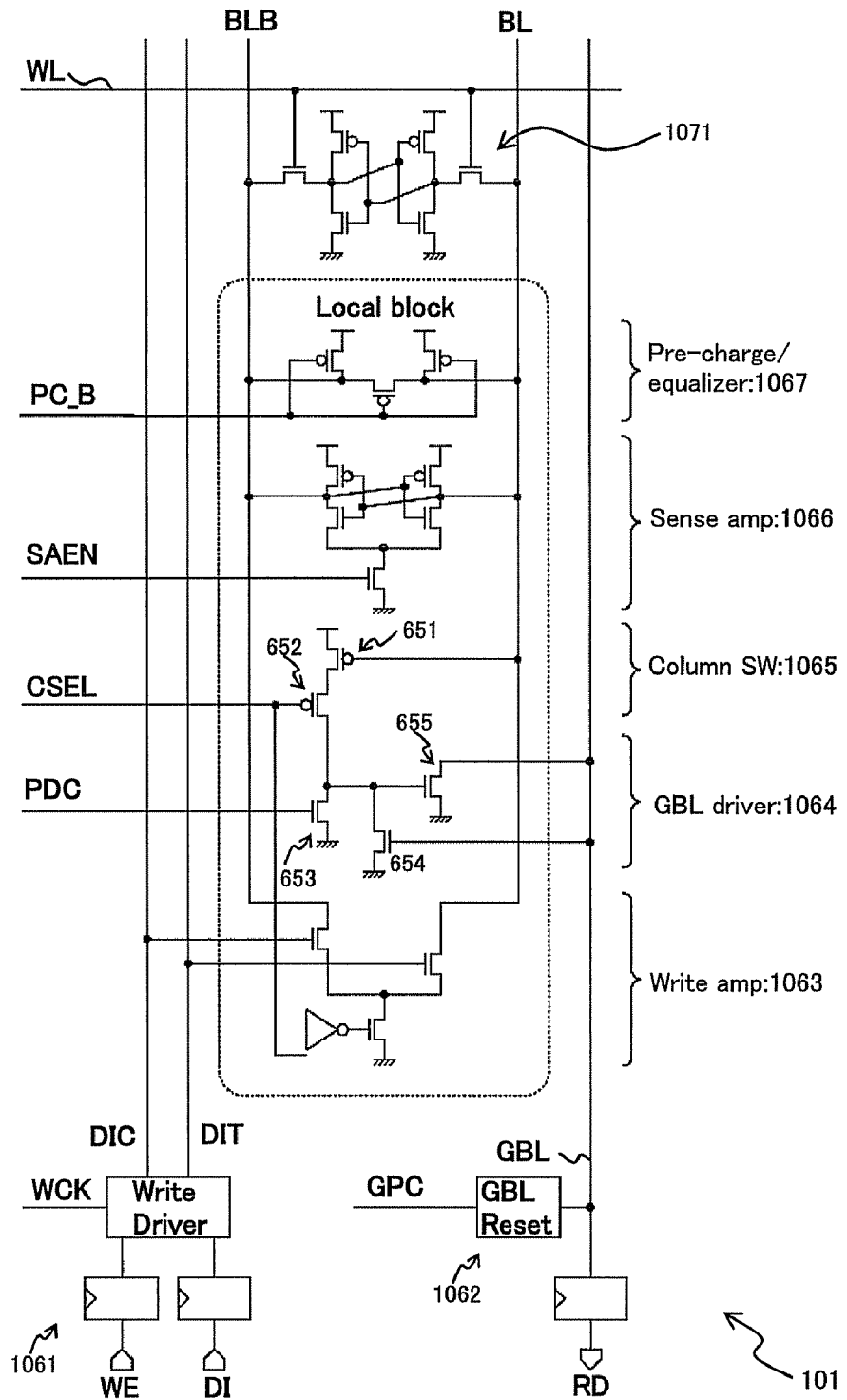
FIG. 13 is a diagram showing an example of part of circuit configuration of the known SRAM.
Figure 14:
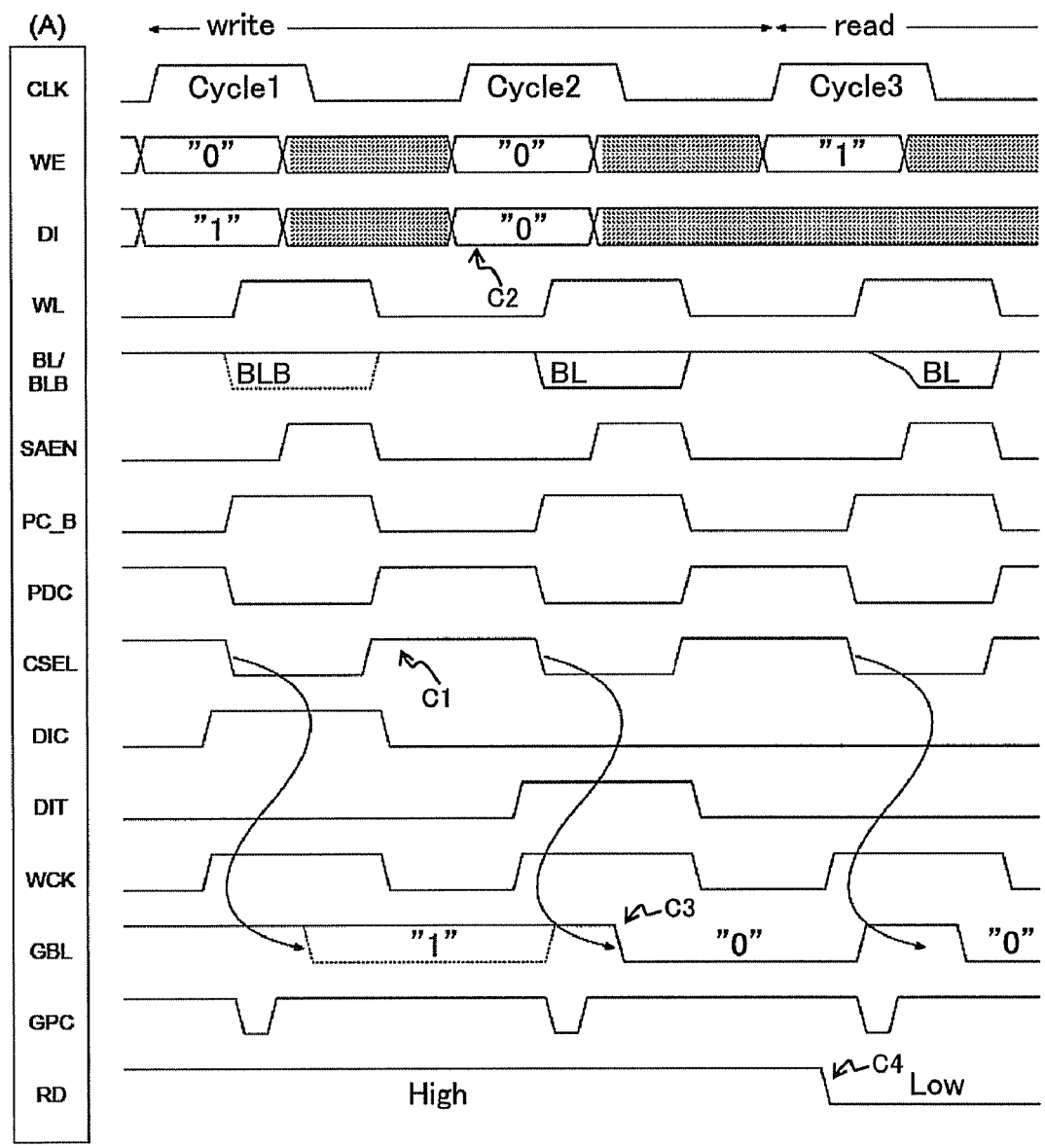
FIG. 14 is a timing chart showing an example of state of signals at the time of data writing in the known SRAM.

FIG. 10 is a diagram showing an example of circuit layout of the memory circuit 1d according to the fourth embodiment of the memory circuit and the control method thereof.

The memory circuit 1d of the fourth embodiment can be realized by laying out the parts as shown in FIG. 10, for example.

Areas surrounded by lines in FIG. 10 correspond to circuits of the parts shown in FIG. 3, showing only circuits for one column of the eight columns, excepting the GBL driver 13d.

The memory circuits 1a to 1e according to the other embodiments of the memory circuit and the control method thereof can be realized like the memory circuit 1d, as a matter of course.

According to the disclosed memory circuit and control method thereof, a circuit from the first bit line to the global signal line is shut off at the time of data writing so that the write signal is not outputted to the output terminal through the global signal line, which reduces the power consumption.

By using the write signal outputted from the write signal driving circuit without a change, a new wiring channel is unnecessary, an increase in number of the elements can be suppressed, and the area overhead can be decreased.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A memory circuit comprising:
a write signal driving circuit connected to a data input signal line to which write data is inputted from the outside, a write enable signal line for permitting the write data to be written, a first write signal line, and a second write signal line to output a first write signal and a second write signal from said first write signal line and said second write signal line, respectively, based on the write data from said data input signal line and a write enable signal from said write enable signal line;
a write signal amplifying circuit connected to a column signal line for selecting a column of said memory circuit to write or read data, said first write signal line, said second write signal line, a first bit signal line and a second bit signal line to output the first write signal and the second write signal inputted from said first write signal line and said second write signal line as a first driving write signal and a second driving write signal from said first bit signal line and said second bit signal line, respectively, based on a column signal inputted from said column signal line;
a memory cell circuit connected to said first bit signal line and said second bit signal line to store data, based on the first driving write signal and the second driving write signal inputted from said first bit signal line and said second bit signal line, and to output the stored data as a first read signal and a second read signal from said first bit signal line and said second bit signal line; and
a global signal driving circuit connected to said first bit signal line, said first write signal line, said column signal line and a global signal line for outputting data stored in said memory cell circuit to the outside to output the first read signal as a global signal from said global signal line when the first read signal is inputted from said first bit signal line, and to inhibit the first driving write signal from being outputted to said global signal line, based on the first write signal inputted from said first write signal line, when the first driving write signal is inputted from said first bit signal line, with the column signal inputted from said column signal line.

2. The memory circuit according to claim 1, wherein said global signal driving circuit comprises:
a first transistor having a first gate terminal connected to said first bit signal line and a first source terminal connected to a power source to output the first read signal or the first driving write signal inputted from said first gate terminal from a first drain terminal thereof; and
a second transistor having a second gate terminal connected to said first write signal line and a second source terminal connected to said first drain terminal to output the first read signal inputted from said first source terminal from a second drain terminal thereof, and to inhibit the first driving write signal from being outputted from said second drain terminal, based on the first write signal inputted from said first gate terminal, when the first driving write signal is inputted from said first source terminal.

3. The memory circuit according to claim 2, wherein said global signal driving circuit further comprises:
a third transistor having a third gate terminal connected to said column signal line and a third source terminal connected to said second drain terminal to inhibit the first read signal or the first driving write signal from being outputted from a third drain terminal thereof, based on the column signal inputted from said third gate terminal, when said memory circuit is not selected.

4. The memory circuit according to claim 1, wherein said global signal driving circuit comprises:
a first transistor having a first gate terminal connected to said first bit signal line and a first source terminal connected to a power source to output the first read signal or the first driving write signal inputted from said first gate terminal from a first drain terminal thereof;
a second transistor having a second gate terminal connected to said column signal line and a second source terminal connected to said first drain terminal to inhibit the first read signal or the first driving write signal from being outputted from a second drain terminal thereof, based on the column signal inputted from said second gate terminal, when said memory circuit is not selected;
an output circuit having a third transistor having a third gate terminal connected to said second drain terminal, a third drain terminal connected to said global signal line and a third source terminal, and a fourth transistor having a fourth gate terminal connected to said global signal line, a fourth drain terminal connected to said second drain terminal and said third gate terminal, and a fourth source terminal connected to said third source terminal to output the first read signal or the first driving write signal inputted from said third gate terminal to said global signal line; and an inhibit circuit having an inverter connected to said first write signal line to invert the first write signal inputted from said first write signal line, and a fifth transistor having a fifth gate terminal to which the inverted first write signal outputted from said inverter circuit is inputted, a fifth drain terminal connected to said third source terminal and said fourth source terminal and a fifth source terminal grounded to inhibit the first driving write signal from said output circuit from being outputted to said global signal line, based on the first write signal inputted from said first write signal line.

5. A control method of a memory circuit having a write signal driving circuit inputted thereto write data and outputting a write signal, a write signal amplifying circuit inputted thereto the write signal and outputting a driving write signal, a memory cell circuit inputted thereto the driving write signal and storing data and outputting a read signal and a global signal driving circuit inputted thereto the read signal and outputting a global signal, the control method comprising the steps of:

by said write signal driving circuit connected to a data input signal line to which the write data is inputted from the outside, a write enable signal line for permitting the write data to be written, a first write signal line and a second write signal line, outputting a first write signal and a second write signal from said first write signal line and said second write signal line, respectively, based on the write data from said data input signal line and a write enable signal from said write enable signal line;

by said write signal driving circuit connected to a column signal line for selecting a column of said memory circuit to write or read data, said first write signal line, said second write signal line, a first bit signal line and a second bit signal line, outputting the first write signal and the second write signal inputted from said first write signal line and said second write signal line as a first driving write signal and a second driving write signal from said first bit signal line and said second bit signal line, based on a column signal inputted from said column signal line;

by said memory cell circuit connected to said first bit signal line and said second bit signal line, storing data, based on the first driving write signal and the second driving write signal inputted from said first bit signal line and said second bit signal line, and outputting the stored data as a first read signal and a second read signal from said first bit signal line and said second bit signal line; and by said global signal driving circuit connected to said first bit signal line, said first write signal line, said column signal line and a global signal line for outputting data stored in said memory cell circuit to the outside, outputting the first read signal as the global signal from said global signal line when the first read signal is inputted from said first bit signal line, and inhibiting the first driving write signal from being outputted to said global signal line, based on the first write signal inputted from said first write signal line, when the first driving write signal is inputted from said first bit signal line, with the column signal inputted from said column signal line.

6. The control method according to claim 5, wherein said global signal driving circuit comprises:

a first transistor having a first gate terminal connected to said first bit signal line and a first source terminal connected to a power source to output the first read signal or the first driving write signal inputted from said first gate terminal from a first drain terminal thereof; and a second transistor having a second gate terminal connected to said first write signal line and a second source terminal connected to said first drain terminal to output the first read signal inputted from said first source terminal from a second drain terminal thereof, and to inhibit the first driving write signal from being outputted from said second drain terminal, based on the first write signal inputted from said first gate terminal, when the first driving write signal is inputted from said first source terminal.

7. The control method according to claim 6, wherein said global signal driving circuit further comprises:

a third transistor having a third gate terminal connected to said column signal line and a third source terminal connected to said second drain terminal to inhibit the first read signal or the first driving write signal from being outputted from a third drain terminal thereof, based on the column signal inputted from said third gate terminal, when said memory circuit is not selected.

8. The control method according to claim 5, wherein said global signal driving circuit further comprises:

a first transistor having a first gate terminal connected to said first bit signal line and a first source terminal connected to a power source to output the first read signal or the first driving write signal inputted from said first gate terminal from a first drain terminal thereof;

a second transistor having a second gate terminal connected to said column signal line and a second source terminal connected to said first drain terminal to inhibit the first read signal or the first driving write signal from being outputted from a second drain terminal thereof, based on the column signal inputted from said second gate terminal, when said memory circuit is not selected;

an output circuit having a third transistor having a third gate terminal connected to said second drain terminal, a third drain terminal connected to said global signal line and a third source terminal, and a fourth transistor having a fourth gate terminal connected to said global signal line, a fourth drain terminal connected to said second drain terminal and said third gate terminal, and a fourth source terminal connected to said third source terminal to output the first read signal or the first driving write signal inputted from said third gate terminal to said global signal line; and an inhibit circuit having an inverter connected to said first write signal line to invert the first write signal inputted from said first write signal line, and a fifth transistor having a fifth gate terminal to which the inverted first write signal outputted from said inverter circuit is inputted, a fifth drain terminal connected to said third source terminal and said fourth source terminal and a fifth source terminal grounded to inhibit the first driving write signal from said output circuit from being outputted to said global signal line, based on the first write signal inputted from said first write signal line.

* * * * *